United States Patent [19]

Matsuda

[11] Patent Number: 5,334,859
[45] Date of Patent: Aug. 2, 1994

[54] THIN-FILM TRANSISTOR HAVING SOURCE AND DRAIN ELECTRODES INSULATED BY AN ANODICALLY OXIDIZED FILM

[75] Inventor: Kunihiro Matsuda, Sagamihara, Japan

[73] Assignee: Casio Computer Co., Ltd., Tokyo, Japan

[21] Appl. No.: 939,458

[22] Filed: Sep. 2, 1992

[30] Foreign Application Priority Data

| Sep. 5, 1991 | [JP] | Japan | 3-252845 |
| Nov. 26, 1991 | [JP] | Japan | 3-335553 |
| Nov. 27, 1991 | [JP] | Japan | 3-335875 |
| Dec. 13, 1991 | [JP] | Japan | 3-351328 |
| Dec. 13, 1991 | [JP] | Japan | 3-351329 |

[51] Int. Cl.$^5$ .................. H01L 29/04; H01L 27/01
[52] U.S. Cl. .................. 257/57; 257/59; 257/66; 257/72; 257/347
[58] Field of Search ............ 257/57, 59, 66, 72, 257/347

[56] References Cited

U.S. PATENT DOCUMENTS

| 4,624,737 | 11/1986 | Shimbo | 257/57 |
| 5,166,085 | 11/1992 | Wakai et al. | 257/59 |

FOREIGN PATENT DOCUMENTS

| 0361609 | 4/1990 | European Pat. Off. | 257/59 |
| 0372821A3 | 6/1990 | European Pat. Off. | 257/59 |
| 2-249272 | 10/1990 | Japan | 257/59 |

OTHER PUBLICATIONS

Patent Abstracts of Japan, vol. 10, No. 367 (E-462) (2424) Dec. 9, 1986, & JP-A-61 164 267 (NEC), Jul., 1986.
Patent Abstracts of Japan, vol. 10, No. 255 (E-433) Sep. 2, 1986, & JP-A-61 084 057 (Fuji Xerox) Apr., 1986.
Patent Abstracts of Japan, vol. 13, No. 279 (P-891) (3627) Jun. 27, 1989 & JP-A-01 68 730 (Seiko) Mar., 1989.

Primary Examiner—Rolf Hille
Assistant Examiner—Steven Loke
Attorney, Agent, or Firm—Frishauf, Holtz, Goodman & Woodward

[57] ABSTRACT

A thin-film transistor panel comprises an insulative substrate, a plurality of thin-film transistor elements arranged at predetermined intervals on said substrate, and wirings electrically connecting the thin-film transistor elements characterized in that the thin-film transistor element comprises a gate electrode, a gate-insulating film, an i-type semiconductor layer to face the gate electrode through the gate insulating film therebetween, an n-type semiconductor layer, source and drain electrodes electrically connected the portions of the i-type semiconductor layer through the n-type semiconductor layer, and an anodically oxidized film located between the source and drain electrodes to electrically isolate, said source and drain electrodes.

20 Claims, 15 Drawing Sheets

THIN-FILM TRANSISTOR HAVING SOURCE AND DRAIN ELECTRODES INSULATED BY AN ANODICALLY OXIDIZED FILM

BACKGROUND OF THE INVENTION

1. Field of the Invention

The present invention relates to a thin-film transistor of an inverse stagger type or the like and a method of manufacturing the thin-film transistor.

2. Description of the Related Art

Known as a thin-film transistor for use as, for example, one of the active elements of an active matrix liquid-crystal display is one having an inverse stagger structure. The thin-film transistor of this type comprises a substrate, a gate electrode formed on the substrate, a gate-insulating film formed on the gate electrode, an 1-type semiconductor layer formed on the gate-insulating film, an n-type semiconductor layer formed on the i-type semiconductor layer, a source electrode formed on one end portion of the n-type semiconductor layer, a drain electrode formed on the other end portion of the n-type semiconductor layer.

The method which is commonly employed to manufacture a thin-film transistor having the inverse stagger structure will be described, with reference to FIGS. 18A to 18E.

FIGS. 18A to 18E are cross-sectional views explaining the method of manufacturing the conventional thin-film transistor, which is formed on one of the transparent substrates of an active matrix liquid-crystal display and used as an active element for a pixel electrode.

[Step 1]

First, as is shown in FIG. 18A, a gate electrode 2G is formed on a transparent substrate 1 made of insulative material such as glass. Next, a wiring or a scanning line (not shown) is formed on the substrate 1, which is connected to the the gate electrode 2G. A gate-insulating film 3 is formed on the substrate 1, the gate electrode 2G and the scanning line. Further, an i-type semiconductor layer 4 is formed on the gate-insulating film 3, and a blocking insulation layer 7 is formed on the i-type semiconductor layer 4, protecting the layer 4.

The gate electrode 2G and the scanning line (not shown) are formed by depositing Ta, Ta-Mo alloy, Cr, or the like on the substrate 1 by means of sputtering or plating, and then by patterning the resultant metal layer by means of photolithography.

In most cases, the gate-insulating film 3 is made of SiN (silicon nitride) or the like, the i-type semiconductor layer 4 is made of a-Si (amorphous silicon), and the blocking insulation layer 7 is made of the same insulative material (SiN or the like) as the gate-insulating film 3. The film 3, the layer 4, and the layer 7 are continuously formed by plasma CVD method.

[Step 2]

Next, as is shown in FIGS. 18B, the blocking insulation layer 7 is patterned by photolithography, to be substantially the same size and shape as that portion of the i-type semiconductor layer 4 which will be a channel region. The i-type semiconductor layer 4 is patterned by photolithography, forming a layer which has a specific shape.

[Step 3]

As is shown in FIG. 18C, an n-type semiconductor layer 5 is formed by plasma CVD method on the substrate 1, covering the i-type semiconductor layer 4 and the insulation layer 7. A metal film 6, which will be processed to be a source electrode and a drain electrode, is formed on the n-type semiconductor layer 5 by means of sputtering. The n-type semiconductor layer 5 is made of a-Si doped with an impurity, and the metal film 6 is made of Cr or the like.

[Step 4]

Then, as is shown in FIG. 18D, the metal film 6 is patterned by photolithography, forming a source electrode 6S, a drain electrode 6D, and a wiring or a data line (not shown) connected to the drain electrode 6D. Further, the n-type semiconductor layer 5 is etched away, except for those portions which are located beneath the source electrode 6S and the drain electrode 6D to separate the layer 5 at the the channel region. As a result, a thin-film transistor is manufactured.

If the n-type semiconductor layer 5 contacts the channel region of the i-type semiconductor layer 4 at the time etching the n-type semiconductor layer 5, the surface of the channel region of the i-type semiconductor layer 4 will also be etched, inevitably damaging the i-type semiconductor layer 4 and degrading the characteristics of the thin-film transistor. In the method described above, the blocking insulation layer 7 is formed on the channel region of the i-type semiconductor layer 4, and the i-type semiconductor layer 4 is therefore prevented from being etched when the n-type semiconductor layer 5 is etched. Hence it is possible to manufacture a thin-film transistor which has good characteristics.

FIG. 18E shows the thin-film transistor thus manufactured and provided with a pixel electrode 8a which is formed on the gate-insulating film 3. The pixel electrode 8a has been by patterning a transparent conductive film made of ITO or the like. The electrode 8a has its one end portion laid on the source electrode 6S, and is thereby electrically connected to the source electrode 6S.

In the prior-art method of manufacturing a thin-film transistor, which has been described above, selective etching is performed on the n-type semiconductor layer 5, thereby removing that portion of this layer 5 which is located above the channel region of the i-type semiconductor layer 4. It is therefore necessary to prevent the i-type semiconductor layer 4 from being etched during the selective etching of the layer 5, so that the i-type semiconductor layer 4 may not be damaged. To this end, the blocking insulation film 7 must be formed on the channel region of the i-type semiconductor layer 4.

Hence, it is required that the blocking insulation layer 7 be patterned by photolithography, before the n-type semiconductor layer 5 and the metal film 6 are formed. The method inevitably have a large number of steps. This means that the manufacturing cost of the thin-film transistor is high if the transistor is made by the conventional method.

To make matter worse, since the blocking insulation layer 7 is made of, as in most cases, the same insulative material (e.g., SiN) as the gate-insulating film 3, the etching solution applied for patterning the layer 7 flows via pinholes made, if any, in the i-type semiconductor layer 4, and reaches the gate-insulating film 3. Thus, the gate-insulating film 3 is enviably etched, too. Due to such undesired etching of the film 3 which has occurred during the patterning of the blocking insulation layer 7, the gate-insulating film 3 has pin holes. It is through these pin holes that the gate electrode 2G, the source electrode 6S, and the drain electrode 6D are short-circuited.

SUMMARY OF THE INVENTION

An object of the present invention is to provide a thin-film transistor in which that portion of an n-type semiconductor layer which is located above the channel region of an i-type semiconductor layer can electrically separate source and drain regions, without forming a blocking insulation film on the channel region of the i-type semiconductor layer.

Another object of the invention is to provide a method of manufacturing a thin-film transistor, in which that portion of an n-type semiconductor layer which is located above the channel region of an i-type semiconductor layer is electrically separate source and drain regions without requiring a blocking insulation film formed on the channel region of the i-type semiconductor layer, thereby reducing the manufacturing cost of a thin-film transistor, and which prevents the forming of pinholes in a gate-insulating film, thus preventing the short-circuiting of a gate electrode with a source electrode or a drain electrode, and ultimately increasing the yield of the thin-film transistor.

According to this invention, said portion of the n-type semiconductor layer is made electrically insulative by means of anodic oxidation, not removed by means of etching. More specifically, that portion of the n-type semiconductor layer which is located above the space between a source electrode and a drain electrode is oxidized anodically, and thus rendered electrically insulative.

In the method of the invention, a blocking insulation layer need not be formed on the channel region of an i-type semiconductor layer as in the conventional method, since said portion of the n-type semiconductor layer is not removed by etching, but is oxidized anodically and thereby made electrically insulative. Hence, although no blocking insulation films are formed, the i-type semiconductor layer remains free of damage whatever while a thin-film transistor is being manufactured.

Since no blocking insulation layer needs to be formed, there is no possibility that pin holes are formed in a gate-insulating film during the manufacture of the thin-film transistor, unlike in the conventional method of manufacturing a thin-film transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A thin-film transistor formed on one of the transparent substrates of an active matrix liquid-crystal display and designed for use as the active element for a pixel electrode, and an array of thin-film transistors of this type (i.e., a TFT array), both being a first embodiment of the present invention, will be described with reference to FIG. 1 and FIGS. 2A to 2D.

Figure 1:
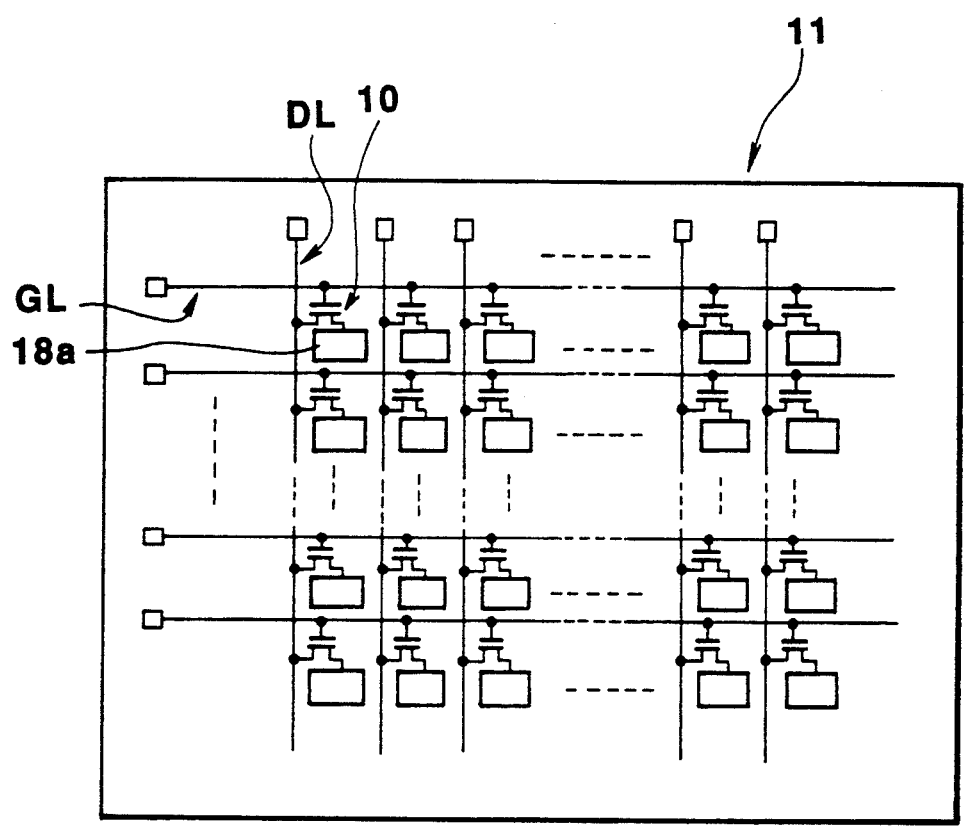
FIG. 1 is a plan view showing a thin-film transistor array according to a first embodiment of the present invention.

FIG. 1 is a schematic plan view of the TFT array. As is shown in this figure, the TFT array comprises a substrate 11, a plurality of scanning lines GL formed on the substrate 11 and extending parallel to one another, a plurality of data lines DL extending parallel to one another and at right angles to the scanning lines GL, a plurality of TFT elements 10 arranged in rows and columns, each having its gate electrode connected to one of the scanning line and its drain connected to one of the data lines DL, and a plurality of pixel electrodes 18a arranged in rows and columns and connected to the TFTs, respectively, thus forming a display region.

Each TFT element 10 and each pixel electrode 18a, which are located at the intersection of a scanning line GL and a data line DL, will now be described with reference to FIG. 2D. As is shown in FIG. 2D, the TFT element 10 comprises a gate electrode 12G, a gate-insulating film 13 covering the gate electrode 12G, an i-type semiconductor layer 14 of amorphous silicon formed on that portion of the film 13 which is located above the electrode 12G, an n-type semiconductor layer 15 formed on the i-type layer 14, a drain electrode 16D formed on that portion of the n-type layer 15 which is located on one end portion of the i-type layer 14, and a source electrode 16S formed on that portion of the n-type layer 15 which is located on the other end portion of the i-type layer 14. The gate electrode 12G is integral with one of the scanning lines GL formed on the substrate 11. The drain electrode 16D is connected to an data line DL, and the source electrode 16S is connected to one of the pixel electrodes 18a which are made of transparent conductive film. The i-type semiconductor layer 14 has a channel region which has been anodically oxidized and, thus, functions as an insulative film 15a.

It will now be explained how the TFT 10 is manufactured, with reference to FIGS. 2A to 2D.

[Step 1]

Figure 2A:
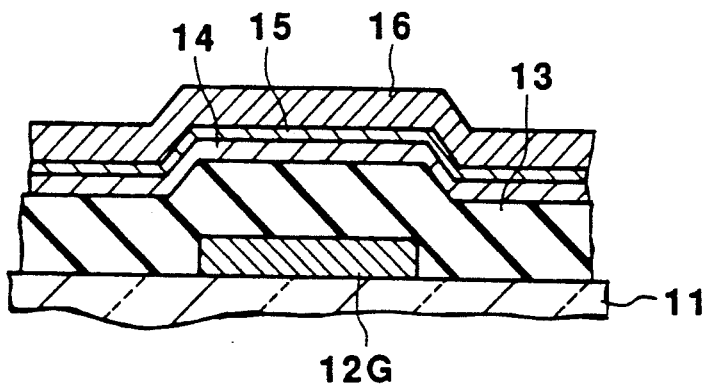
FIGS. 2A to 2D are cross-sectional views explaining a method of manufacturing a thin-film transistor, which is the first embodiment of the invention.

First, as is shown in FIG. 2A, a gate electrode 12 is formed on a transparent substrate 11 made of insulative material such as glass. Next, a scanning line GL is formed on the substrate 1, which is connected to the the gate electrode 12. A gate-insulating film 13 made of SiN or the like is formed by plasma CVD method on the substrate 11, the gate electrode 12 and the scanning line. Further, an i-type semiconductor layer 14 made of a-Si is formed on the gate-insulating film 13 by means of plasma CVD method. Then, an n-type semiconductor layer 15 made of a-Si doped with an n-type impurity is formed on the i-type semiconductor layer 14 by means of plasma CVD method. Further, a metal film 16 made of metal such as Cr, which will be processed to be a source electrode and a drain electrode, is formed on the n-type semiconductor layer 15 by means of sputtering.

The n-type semiconductor layer 15 is about 25 to 100 nm thick, whereas the metal film 16 is about 200 to 500 nm thick. The gate electrode 12 and the scanning line GL are formed by depositing Ta, Ta-Mo alloy, Cr, Al, Al-Ti alloy or the like on the substrate 11 by means of sputtering or plating, and then by patterning the resultant metal layer by means of photolithography.

[Step 2]

Figure 2B:
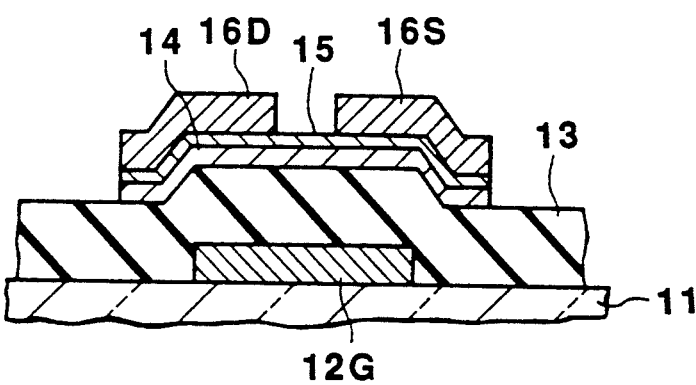

Next, as is shown in FIG. 2B, the metal film 16 is patterned by photolithography, forming a source electrode 16S, a drain electrode 16D, and a data line DL connected to the drain electrode 16D. Thereafter, the n-type semiconductor layer 15 is etched away, except for the those portions located beneath the electrodes 16S and 16D and that portion extending between these electrodes 16S and 16D. Also, the i-type semiconductor layer 14 is etched away, except for those portions which are located beneath the electrodes 16S and 16D and that portion which will be a channel region.

This selective etching of the layers 14 and 15 is accomplished by using both the source electrode 16S and the drain electrode 16D as etching masks, and by forming a resist mask (not shown) on those portions of the n-type layer 15 which are located beneath the source electrode 16S and the drain electrode 16D and on that portion of the layer 15 which extends between the electrodes 16S and 16D.

[Step 3]

Figure 2C:
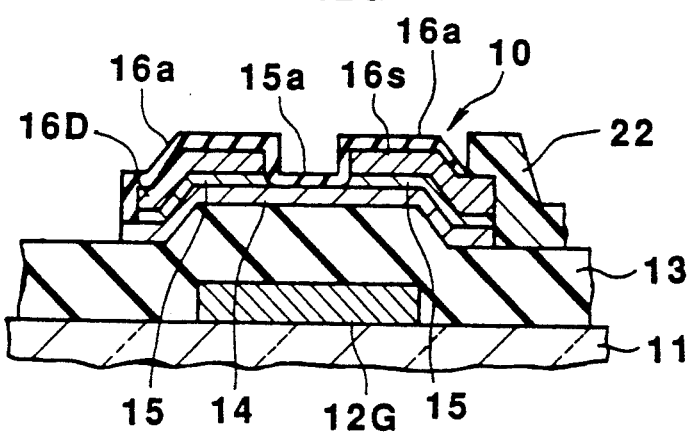
Figure 2D:
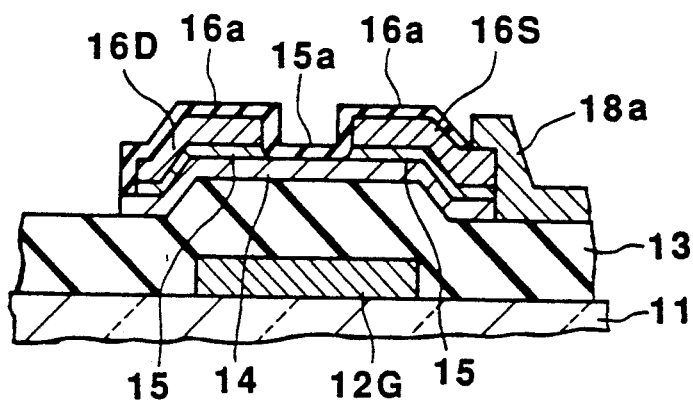

The resist mask is removed from the n-type semiconductor layer 15. Then, as is shown in FIG. 2C, that portion of the n-type semiconductor layer 15, which extends between the electrodes 16S and 16D and is located on that portion of the i-type semiconductor layer 14 which will be the channel region, is oxidized anodically in its entirety thickness direction. This portion of the layer 15, thus oxidized, electrically cuts the n-type semiconductor layer 15 into two parts. Thus, a thin-film transistor 10 is manufactured.

More specifically, the portion of the n-type semiconductor layer 15 is anodically oxidized in the following way. First, the wiring (hereinafter referred as a data line) extending from the drain electrode 16D is connected to the anode of an DC power supply by a clip-type connector. The unfinished product is immersed in a bath of an electrolytic solution (e.g., solution of ammonium borate), except for that end of the data line which is connected to the DC power supply. In the solution bath, the unfinished product is so positioned that the drain electrode 16D opposes an opposite electrode (cathode) placed in the solution bath. In this condition, an electric current is supplied to the n-type semiconductor layer 15 through the data line and the drain electrode 16D. A voltage is thereby applied between the layer 15 and the cathode, achieving the anodic oxidation of the n-type semiconductor layer 15. During this anodic oxidation, that portion of the source electrode 16S is kept covered with a resist mask 22.

When the voltage is applied between the n-type semiconductor layer 15 and the cathode, that portion of the layer 15 acting as anode which is immersed in the electrolytic solution (i.e., the portion extending between the source electrode 16S and the drain electrode 16D) undergoes a chemical reaction and is gradually oxidized from its surface. Upon lapse of a predetermined time, said portion of the n-type semiconductor layer 15 changes into an oxidized insular type layer 15a. The layer 15a electrically cuts the n-type semiconductor layer 15 into two parts.

Once anodically oxidized in its entirety thickness direction as described above, that portion of the n-type semiconductor layer 15 which extends between the electrodes 16S and 16D becomes electrically insulative, whereby the n-type semiconductor layer 15 is electrically cut into two parts.

As the n-type semiconductor layer 15 is anodically oxidized gradually from its exposed surface, whereby the oxidized insulation layer 15a grows thicker, said portion of the layer 15 becomes thinner. Nonetheless, the electric current keeps flowing through the n-type semiconductor layer 15 until the insulation layer 15a grows to reach the surface of the i-type semiconductor layer 14. Hence, that portion of the layer 15 can be anodically oxidized in its entirety thickness direction when the current stops flowing through it, only if the voltage applied is relatively high (for example, about 50 V in the case where the layer 15 is 25 nm thick). Thus, that portion of the layer 15 which extends between the electrodes 16S and 16D is oxidized in its entirety. In other words, it is oxidized until the current stops flowing at the interface between the i-type semiconductor layer 14 and the n-type semiconductor layer 15. As a result, the n-type semiconductor layer 15 is electrically cut into two parts, at the position above that portion of the i-type semiconductor layer 14 which functions as a channel region.

In this embodiment, the anodic oxidation of said portion of the layer 15 is carried out by supplying an electric current to the n-type semiconductor layer 15 through the data line and the drain electrode 16D. Hence, the surfaces of the data line and the drain electrode 16D also undergo chemical reaction in the electrolytic solution bath and are oxidized anodically. In addition, since the electric current is supplied to the source electrode 16S, too, through the n-type semiconductor layer 15, the source electrode 16S is also anodically oxidized at its upper surface. As a result, as is shown in FIG. 2C, the surfaces of the source electrode 16S and the drain electrode 16D form two oxidized insulation layers 16a. These insulation layers 16a protect the source electrode 16S and the drain electrode 16D, respectively.

Any metal is oxidized faster than any n-type semiconductor under the same condition. Therefore, the oxidized insulation layers 16a grows somewhat thicker than the n-type semiconductor layer 15, while said portion of the layer 15 is being oxidized in its entirety thickness direction. The insulation layer 16a on the source electrode 16S is thinner than the insulation layer 16a formed on the drain electrode 16D for two reasons. First, the voltage applied on the source electrode 16S is one dropped in the n-type semiconductor layer 15. Secondly, no voltage is applied to the source electrode 16S once the n-type semiconductor layer 15 has been electrically cut into to parts.

Although the oxidized insulation layers 16a are somewhat thicker than the n-type semiconductor layer 15, both the source electrode 16S and the drain electrode 16D remain thick enough to attain sufficient conductivity. This is because, as has been pointed out, these electrodes 16S and 16D have a thickness of about 200 to 500 nm, far greater that the thickness (i.e., about 25 to 100 nm) of the n-type semiconductor layer 15 before their surfaces are oxidized anodically.

The thin-film transistor, thus manufactured, is used as one of active elements of an active matrix liquid-crystal display. Therefore, its source electrode 16S needs to be electrically connected at an end to a pixel electrode. The end portion of the source electrode 16S will not be electrically connected to the pixel electrode if the surface of this end portion is oxidized anodically. To prevent such an electrical disconnection, the end portion of the electrode 16S is covered with a resist mask 22 as is shown in FIG. 2C before the anodic oxidation is carried out. Since the mask 22 protects the end portion of the electrode 16S from the electrolytic solution, the end portion of the electrode 16S is electrically connected to the pixel electrode, achieving good conduction between the the source electrode 16S and the pixel electrode.

As is shown in FIG. 2D, a pixel electrode 18a is formed on a portion of the gate-insulating film 13. The pixel electrode 18a has a portion formed on one portion of the source electrode 16S of the thin-film transistor. The electrode 18a is made by removing the resist mask 22 from the end portion of the electrode 16S, forming a transparent conductive film made of ITO or the like on the end portion of the electrode 16S, and patterning the conductive film thus formed.

In the method of manufacturing a thin-film transistor, described above, the n-type semiconductor layer is electrically cut at the portion located above the channel region of the transistor, not by means of etching but by means of anodic oxidation. More precisely, that portion of the layer 15 becomes electrically insulative when it is anodically oxidized in its entirety thickness direction, whereby the n-type semiconductor layer 15 is electrically cut into two parts.

Since the n-type semiconductor layer 15 is electrically divided into two parts not by etching, a blocking insulation film need not be formed on the channel region of the i-type semiconductor layer 14 as in the prior-art method. Hence, no damages are done to the i-type semiconductor layer 14 during the manufacture of the thin-film transistor. Without a step of forming a blocking insulation film, the method of the present invention helps to reduce the cost of manufacturing thin-film transistors.

Since no blocking insulation film needs to be formed in the method described above, pinholes re not formed in a gate-insulating film as in the conventional method of manufacturing a thin-film transistor. Thus there is no possibility that the gate electrode 12 is short-circuited with the source electrode 16S or the drain electrode 16D. With this method it is therefore possible to enhance the yield of thin-film transistors.

In the first embodiment, the surface of the source electrode 16S and that of the drain electrode 16D are oxidized at the time of anodically oxidizing the selected portion of the n-type semiconductor layer 15. Instead, only that portion of the layer 15 can be anodically oxidized, with both the source electrode 16S and the drain electrode 16D covered with resist masks.

The method described above, which is the first embodiment of the invention is one for manufacturing a thin-film transistor which is formed on one of the two transparent substrates of an active matrix liquid-crystal display and which is designed as the active element for a pixel electrode. Nonetheless, the method can be used to manufacture a thin-film transistor for any other purpose.

As has been described, the method according to this invention is characterized in that the n-type semiconductor layer is electrically divided into two parts at the portion located above the channel region of the thin-film transistor, not by means of etching but by anodic oxidation. Thus, no damages are done to the i-type semiconductor layer located beneath the n-type semiconductor layer. The method, therefore, has no step of forming a blocking insulation layer, making it possible to manufacture the thin-film transistor at low cost. In addition, there is no possibility that pinholes are formed in the gate-insulating film to cause short-circuiting of the gate electrode, the source electrode or the drain electrode, making it possible to enhance the yield of thin-film transistors.

The advantages of this invention, pointed out in the preceding paragraph, can be attained by the other methods according to this invention, which will be described below.

The thin-film transistor according to a second embodiment of the invention, and the method of manufacturing this invention will be described, with reference to FIGS. 3 to 7 and FIGS. 8A to 8D. The components which are identical or similar to those shown in FIGS. 2A to 2D will be designated at the same reference numerals and will not be described in detail.

Figure 3:
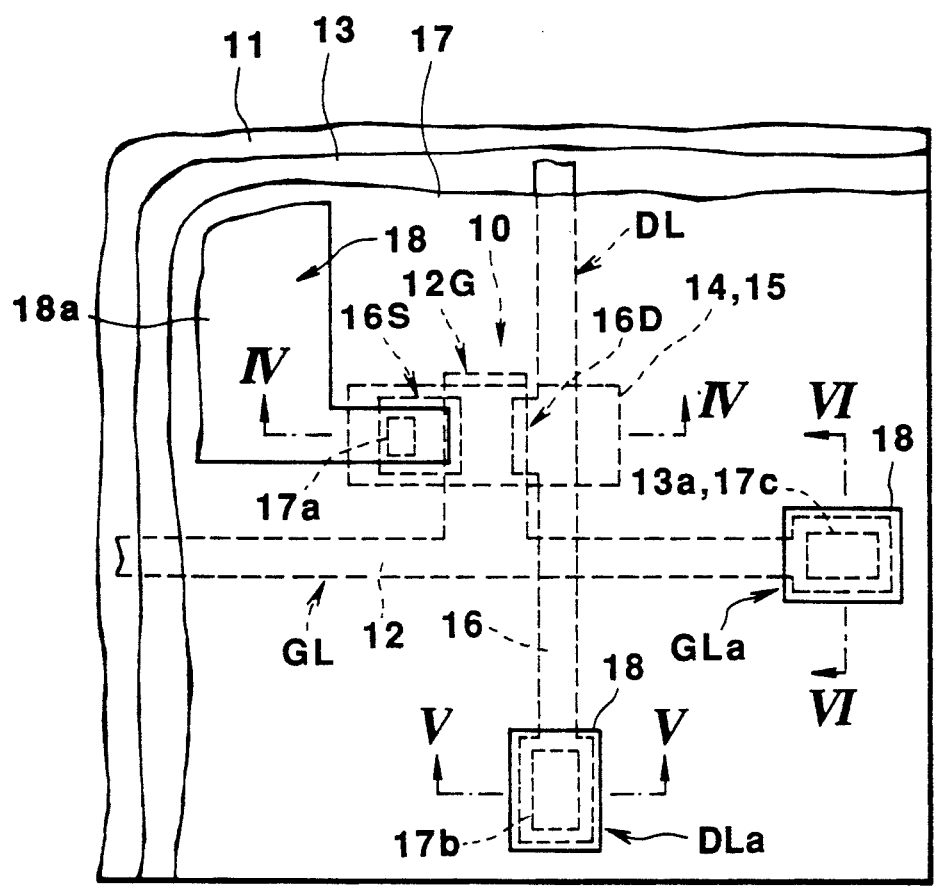
FIG. 3 is a plan view showing a thin-film transistor panel which incorporates the thin-film transistor shown in FIGS. 2A to 2D, and which is a second embodiment of the invention.
Figure 4:
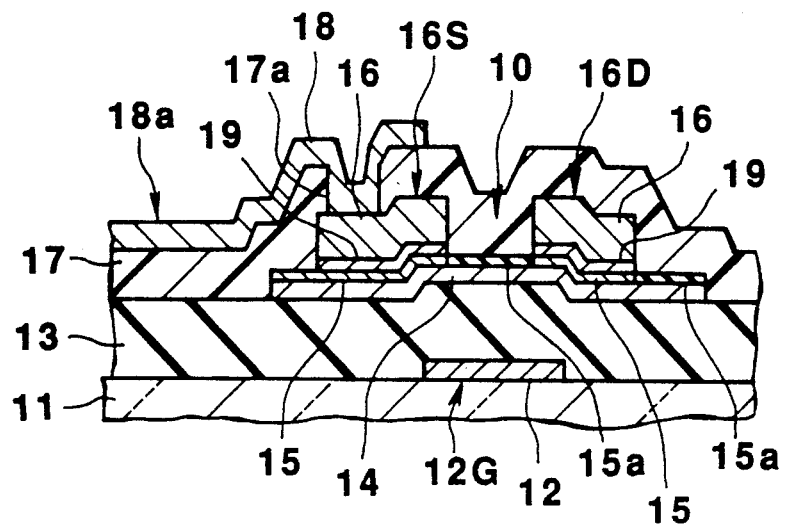
FIGS. 4 to 6 are cross-sectional views of the thin-film transistor panel, taken along line IV—IV line V—V and line VI—VI shown in FIG. 3, respectively.
Figure 5:
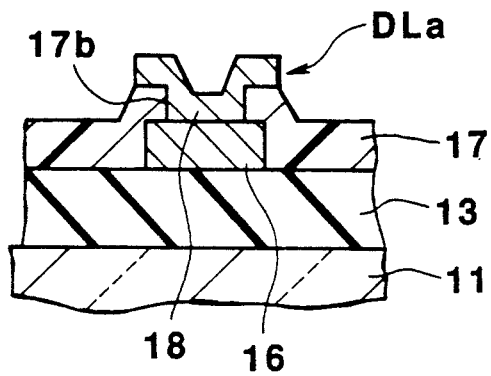
Figure 6:
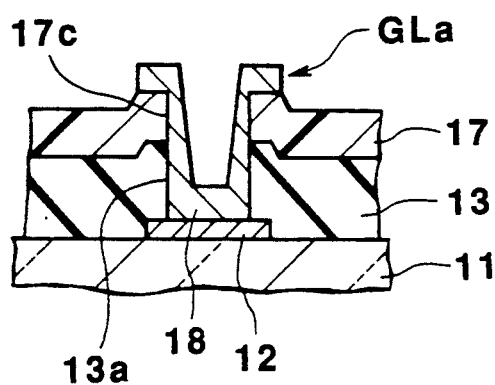

First, the construction of the thin-film transistor, which is the second embodiment of the invention, will be described. FIG. 3 is a plan view showing a part of a thin-film transistor (TFT) panel which incorporates the thin-film transistor. FIGS. 4, 5, and 6 are cross-sectional views of the TFT panel, taken along line IV—IV, line V—V, and line VI—VI shown in FIG. 3, respectively;

The TFT panel comprises a transparent substrate 11 made of glass or the which like, pixel electrodes 18a formed on the substrate 11, and thin-film transistor elements 10 formed on the substrate 11 and functioning as an active elements for the electrodes 18a.

As can be understood from FIGS. 3 and 4, the thin-film transistor element 10 comprises a gate electrode 12G formed on the substrate 11, a gate-insulating film 13 covering the gate electrode 12G, an i-type semiconductor layer 14 formed on a portion of the gate-insulating film 13, an n-type semiconductor layer 15 formed on the i-type semiconductor layer 14, a contact layer 19 formed on the n-type semiconductor layer 15, and a source electrode 16S formed on the contact layer 19, and a drain electrode 16D formed on the contact layer 19. The contact layer 19 is made of metal such as Cr.

The gate electrode 12G is integral with a gate line GL formed on the substrate 11. The gate-insulating film 13 covers both the gate electrode 12G and the gate line GL, and is formed on almost the entire surface of the substrate 11. The film 13 is made of SiN or the like. Formed on the gate-insulating film 13 is a data line DL which is connected to the drain electrode 16D. The gate electrode 12G and the gate line GL are formed of a gate metal film 12 which is made of aluminum or an aluminum alloy. The source electrode 16S, the drain electrode 16D, and the data line DL are formed of a drain metal film 16 which is made of aluminum or an aluminum alloy.

The contact layer 19 is divided into two parts, on which the electrode 16S and and 16D are formed, respectively. That part of the layer 19 on which the source electrode 16S is formed has substantially the same shape and size as the source electrode 16S. Similarly, that part of the layer 19 on which the drain electrode 16D is formed has substantially the same shape and size as the source electrode 16D.

The n-type semiconductor layer 15 is formed on the entire surface of the i-type semiconductor layer 14. That portion of this layer 15 which is located below the gap between the source electrode 16S and the drain electrode 16D has been oxidized in its entirety thickness direction and is, therefore, an insulation layer 15a. The peripheral portions of both semiconductor layers 14 and 15 extend outward from the electrodes 16S and 16D. That peripheral portion of the n-type semiconductor layer 15 which extends outward from the drain electrode 16D has been oxidized and is, thus, an insulation layer 15a. Although not shown in FIG. 3 or FIG. 4, that peripheral portion of the n-type semiconductor layer 15 which extends outward from the source electrode 16S has been slightly oxidized.

The pixel electrode 18a is formed on a protective insulation film 17 which is formed on the gate-insulating film 13. The film 17 covers the thin-film transistor element 10, and is made of SiN or the like. The electrode 18a has been formed by patterning a transparent conductive film 18 made of ITO or the like. Its end extends through the contact hole 17a made in the protective insulation film 17 and is thereby electrically connected to the source electrode 16S of the thin-film transistor element 10.

As is shown in FIGS. 3 and 5, the terminal portion DLa of the data line DL consists of two layers. The lower layer is a part of the gate metal film 12, and the upper film is a part of the transparent conductive film 18, the remaining part of which is the pixel electrode 18a. The upper film (i.e., the transparent conductive film) 18 is deposited on the lower layer (i.e., the gate metal film) 12, in the openings 13a and 17c which are made in the gate-insulating film 13 and the protective insulation film 17, respectively.

The terminal portion GLa of the gate line GL consists of two layers, too, as is shown in FIGS. 3 and 6. The lower layer is a part of the gate metal film 12, and the upper film is a part of the transparent conductive film 18, the remaining part of which is the pixel electrode 18a. The upper film (i.e., the transparent conductive film) 18 is deposited on the lower film (i.e., the gate metal film) 12, in the openings 13a and 17c which are made in the gate-insulating film 13 and the protective insulation film 17, respectively.

With reference to FIGS. 7A to 7D, it will be explained how the thin-film transistor, described above, is manufactured. With reference to FIGS. 8A to 8D, it will be explained how the TFT panel incorporating the transistor is manufactured.

FIGS. 7A to 7D and FIGS. 8A to 8D are cross-sectional views, each showing the thin-film transistor section of the FET panel, the terminal portion of the data line of the thin-film transistor, and the terminal portion of the data line thereof.

[Step 1]

Figure 7A:
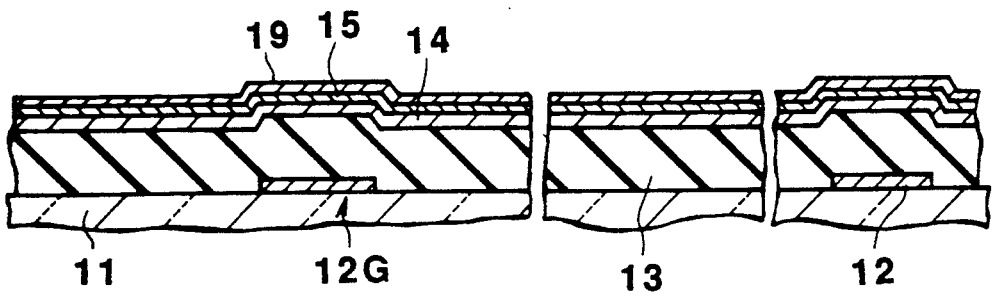
FIGS. 7A to 7D are cross-sectional views explaining how to manufacture the thin-film transistor incorporated in the panel shown in FIGS. 4 to 6, and FIGS. 8A to 8D are cross-sectional views explaining how to manufacture the thin-film transistor panel.

First, as is shown in FIG. 7A, the gate electrode 12G and the gate line GL are formed on the substrate 11 made of glass or the like. The electrode 12G and the gate line GL are formed by depositing the gate metal film 12 on the substrate 11 and patterning the film 12 by means of photolithography. The metal film 12 shown at the upper-right corner of FIG. 7A is the lower film of the terminal portion GLa of the gate line GL.

[Step 2]

As is shown in FIG. 7A, too, the gate-insulating film 13 is formed on the substrate 11, covering the gate electrode 12G and the gate line GL. The i-type semiconductor layer 14 is formed on the gate insulating film 13. The n-type semiconductor layer 15 is formed on the i-type semiconductor layer 14. The contact layer 19 is formed on the n-type semiconductor layer.

[Step 3]

Figure 7B:
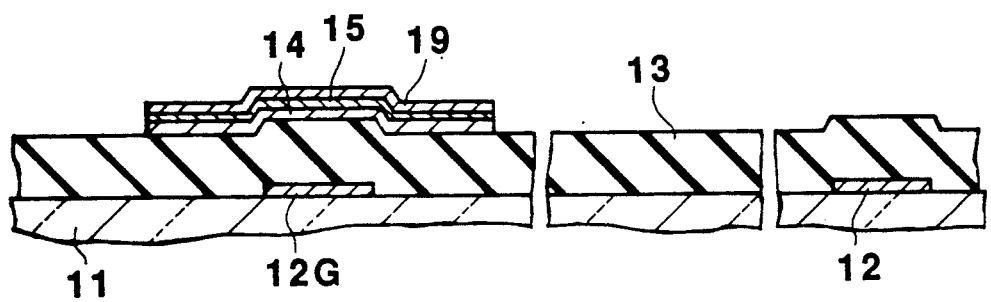

Next, as is shown in FIG. 7B, the contact layer 19, the n-type semiconductor layer 15, and the i-type semiconductor layer 14 are patterned by photolithography, whereby these layers 19, 15, and 14 come to have the shape and size identical to a transistor element region to be formed.

[Step 4]

Figure 7C:
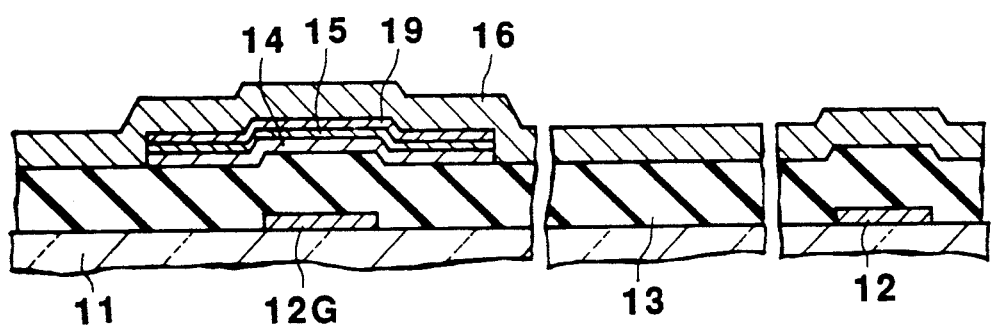

As is shown in FIG. 7C, the metal film 16, which will be patterned into the source electrode 16S and the drain electrode 16D, is formed on the substrate 11 and an the gate-insulating film 13, covering the layers 14, 15, and 19 which have been patterned.

[Step 5]

Figure 7D:
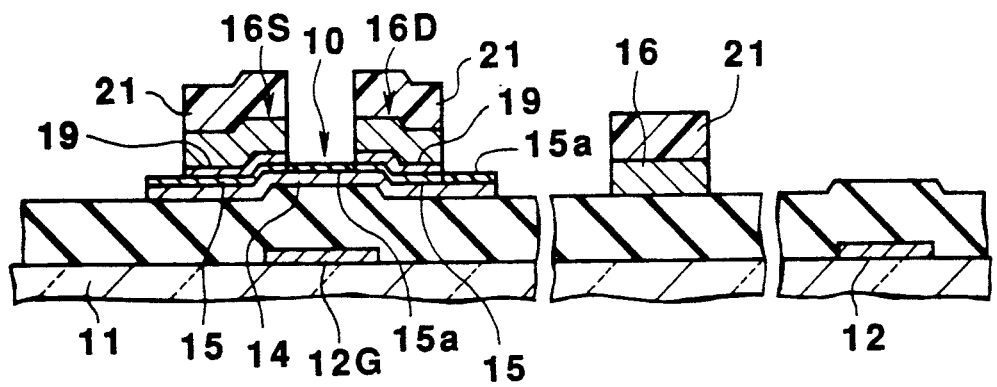

As is shown in FIG. 7D, the metal film 16 is patterned by photolithography, forming the source electrode 16S, the drain electrode 16D, and the data line DL (see FIG. 4). Then, using the resist mask 21 which has been used in patterning the metal film 16, the contact layer 19 is patterned into two pieces of film which have the same shape and size as the source electrode 16S and the drain electrode 16D, respectively. The metal film 16 shown in the upper-right corner of FIG. 7D is the lower film of the terminal portion DLa of the data line.

[Step 6]

As shown in FIG. 7D, too, oxidation is performed on the n-type semiconductor layer 15, using the resist mask 21 which has been used in patterning the metal film 16. That portion of the n-type semiconductor layer 15 which extends between the electrodes 16S and 16D is oxidized in its entirety, thickness direction forming an oxidized insulation layer 15a. The insulation layer 15a, thus formed, electrically isolates the two portions of the n-type semiconductor layer 15, on which the source electrode 16S and the drain electrode 16D are respectively formed. Thus is manufactured the thin-film transistor element 10.

The portion of the n-type semiconductor layer 15 may be oxidized in the same way as in the first embodiment.

Through the data line DL and the drain electrode 16D, an electric current is supplied to the n-type semiconductor layer 15 during the anodic oxidation of said portion of the layer 15. Hence, the n-type semiconductor layers 15 of all thin-film transistor elements (in this figure only one element is shown) which are arranged along the data line DL can be anodically oxidized uniformly. Since the resist mask 21 does not cover neither the sides of the drain electrode 16D nor the sides of the data line DL, the sides of both the electrode 16D and those of the data line DL are oxidized anodically. (The resultant oxide layers are not shown.) Nonetheless, the center portion of the electrode 16D or the center portion of the data line DL is not oxidized at all. Therefore, both the drain electrode 16D and the data line DL maintain as electrically conductive as is desired.

The i-type semiconductor layer 14 and the n-type semiconductor layer 15 extend outward from the peripheries of the electrodes 16S and 16D—that is, from the periphery of the resist mask 21. Hence, that portions of the layer 15 which extend from the periphery of the drain electrode 16D are oxidized, forming the insulation layers 15a. Also, the surface of that portion of the layer 15 which extends from the source electrode 16S, and the sides of the source electrode 16S are slightly oxidized, though not shown in FIGS. 7A to 7D.

The resistivity which the i-type semiconductor layer 14 has when no voltage is applied to the gate electrode 15G is 100 or more times greater than the resistivity of the n-type semiconductor layer 15. Therefore, the i-type semiconductor layer 14, located below the layer 15, is not oxidized at all when the n-type semiconductor layer 15 is oxidized anodically.

The TFT panel is manufactured as will be explained below, after a number of thin-film transistors elements 10 have been formed as has been described above.

[Step 7]

Figure 8A:
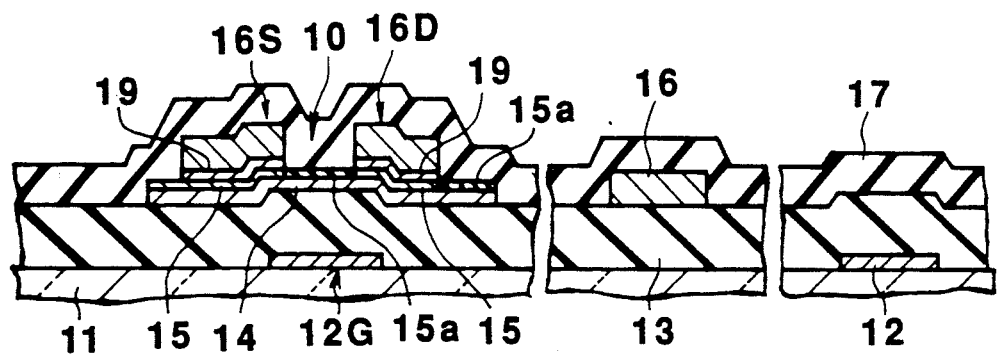

The resist mask 21 is removed. As is shown in FIG. 8A, the protective insulation film 17 is formed on the gate-insulating film 13, thus covering the thin-film transistor elements 10.

[Step 8]

Figure 8B:
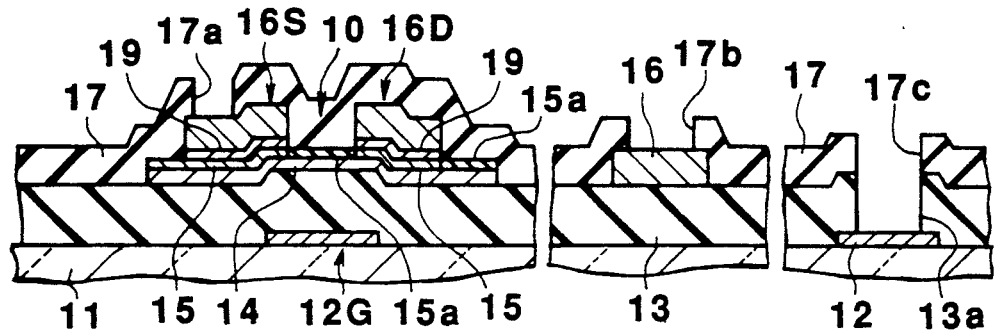

Next, as can be understood from FIG. 8B, the protective insulation film 17 is patterned by means of photolithography, making a contact hole 17a, an opening 17b, and an opening 17c. The hole 17a exposes the source electrode 16S of the transistor element 10; the opening 17b exposes that portion of the metal film 16 which will be connected to the terminal portion DLa of the data line DL; and the opening 17c exposes the gate-insulating film 13. An opening 13a aligned with the opening 17c is formed in the gate-insulating film 13, thus exposing that portion of the metal film 12 which will be connected to the terminal portion GLa of the gate line GL.

Figure 8C:
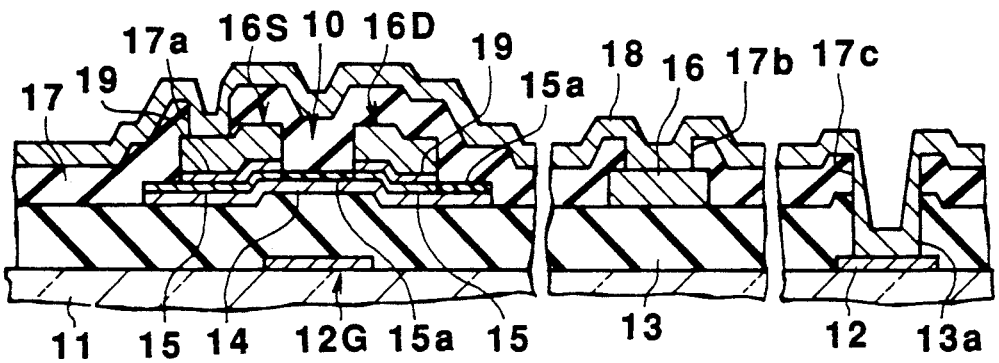

Then, as is shown in FIG. 8C, the transparent conductive film 18 made of ITO or the like is formed on the protective insulation film 17, also in the contact holes 17a and the openings 17b and 17c, all made in the film 17, and also in the opening 13a made in the gate-insulating film 13. Therefore, the film 18 is formed on the source electrode 16S, on the lower film 16 of the terminal pottion DLa of the data line DL, and on the lower film 12 of the terminal portion GLa of the gate line GL.

Figure 8D:
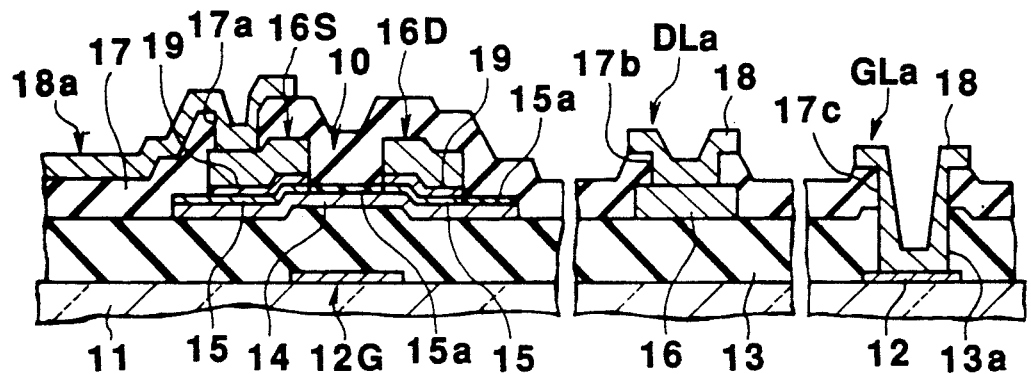

Further, as is shown in FIG. 8D, the transparent conductive film 18 is patterned by photolithography, forming the pixel electrode 18a, the upper film of the terminal portion DLa of the data line DL, and the upper film of the terminal portion GLa of the gate line GL. As a result, the TFT panel is manufactured.

A third embodiment of the invention will now be described, with reference to FIGS. 9A to 9E and FIG. 10. FIGS. 9A to 9E are cross-sectional views, each showing the thin-film transistor element and terminal portions of drain and gate lines of a TFT panel. FIG. 10 is a plan view of the thin-film transistor element and the terminals portions of the drain and gate lines.

[Step 1]

Figure 9A:
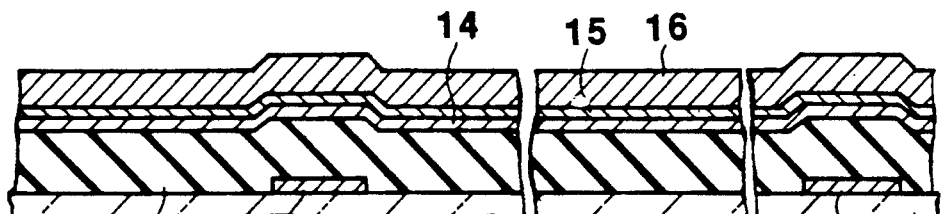
FIGS. 9A to 9E are cross-sectional views explaining a method of manufacturing a thin-film transistor panel which is a third embodiment of the invention.
Figure 10:
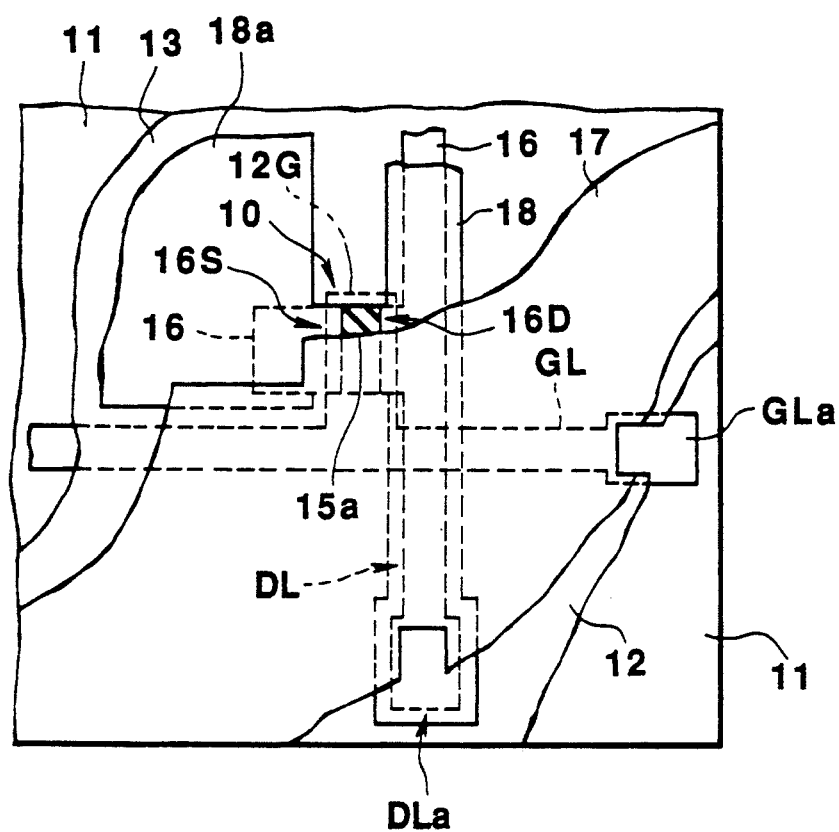
FIG. 10 is a plan view of the thin-film transistor panel according to the third embodiment of the present invention.

As is shown in FIG. 9A, a gate metal film of Al, an Al alloy, Cr, Ta, or the like is formed on a transparent substrate 11 made of glass or the like. The gate metal film is patterned by photolithography, forming a gate line GL and a gate electrode 12G as is shown in FIG. 10. In FIG. 9A, GLa is the terminal portion of the gate line GL.

[Step 2]

Next, as is shown in FIG. 9A, a gate-insulating film 13 made of SiN or the like is formed on the substrate 11, covering both the gate line GL and the gate electrode 12G. An i-type semiconductor layer 14 is then formed on the gate-insulating film 13. Further, an n-type semiconductor layer 15, which is made of a-Si doped with an n-type impurity, is formed on the i-type semiconductor layer 14. Still further, a metal film 16 made of Al, an Al alloy, Cr, Ta, or the like is formed on the n-type semiconductor layer 15. The film 16 will be processed to form a source electrode and a drain electrode.

[Step 3]

Figure 9B:
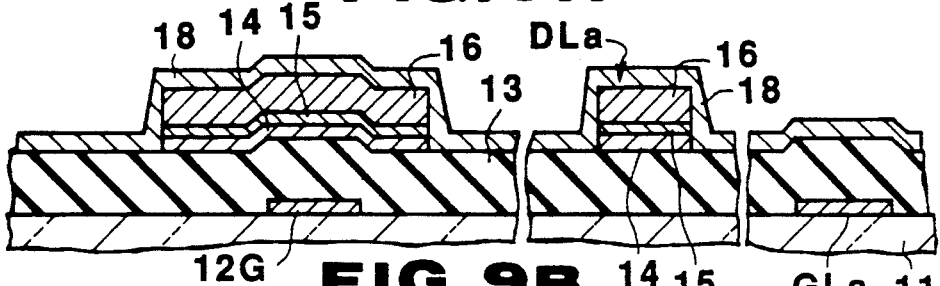

Then, as is shown in FIG. 9B, the metal film 16, the n-type semiconductor layer 15, and the i-type semiconductor layer 14 are patterned by photolithography, each into two portions having substantially the same size and shapes as a drain line DL (see FIG. 9) and a transistor region. In FIG. 9B, DLa is the terminal portion of the drain line DL.

[Step 4]

As is shown in FIG. 9B, too, a transparent conductive film 18 made of ITO or the like is formed on the gate-insulating film 13, thus covering the the metal film 16, already patterned.

[Step 5]

Figure 9C:
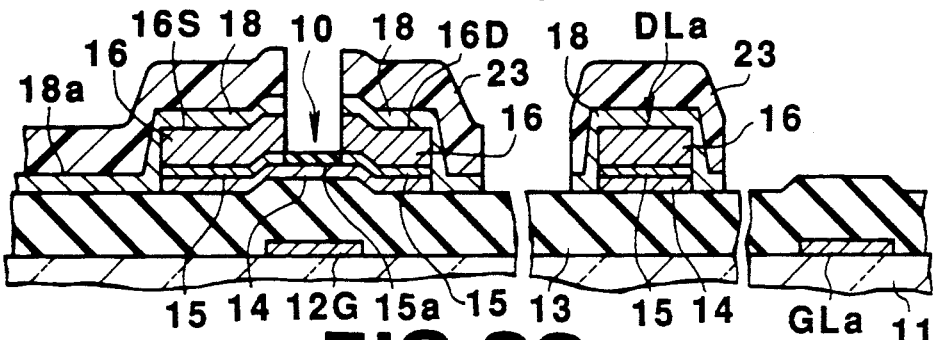

Next, as is shown in FIG. 9C, a resist mask 23 is formed on the the transparent conductive film 18. Using the mask 23, the film 18 is patterned by means of photolithography, into three portions. These three portions have the substantially the same sizes and shapes as a source electrode 16S, a drain electrode 16D, and a drain line DL, respectively, which will be formed. Using the resist mask 23 again, the metal film 16 located on the region of the transistor element is selectively etched, forming the source electrode 16S and the drain electrode 16D.

The source electrode 16S, the drain electrode 16D, and the drain line DL, which have been formed in Steps 3 to 5, consist of two layers, the lower layer being a part of the metal film 16, and the upper layer being a part of the transparent conductive film 18. A portion of the n-type semiconductor layer 15 remains beneath the drain line DL including the terminal portion DLa thereof. Also, a portion of the i-type semiconductor layer 14 remains below the drain line DL.

In the third embodiment, the transparent conductive film 18 is patterned into portions on the source electrode 16S, the drain electrode 16D and the drain line DL, these portions being a little broader than the the electrodes 16S and 16D and the drain line DL. As a result of this, the film 18 covers the electrodes 16S and 16D entirely, but the opposing sides thereof, and covers the drain line DL entirely.

[Step 6]

As is shown in FIG. 9C, using the resist mask 23 once used in patterning the transparent conductive film 18, the n-type semiconductor layer 15 is oxidized anodically, thereby electrically isolating those two parts of the layer 15 which are located beneath the source electrode 16S and the drain electrode 16D. A thin-film transistor element 10 is thereby made.

The anodic oxidation of the n-type semiconductor layer 15 is accomplished by immersing the layer 15 in an electrolytic solution, opposing the layer 15, acting as anode, to a platinum electrode (not shown) also immersed in the electrolytic solution and functioning as cathode, and applying a voltage between the layer 15 and the platinum electrode. That portion of the layer 15, which is not covered with the resist mask 23 and which contacts the electrolytic solution, undergoes a chemical reaction and is oxidized anodically. Said portion of the n-type semiconductor layer 15 is thereby changed to an insulation layer 15a.

The depth to which the n-type semiconductor layer 15 is oxidized depends, mainly on the voltage applied between the layer 15 and the platinum electrode. Hence, the selected portion of the layer 15 is anodically oxidized entirely in its thickness direction, provided that a voltage proportional to the thickness of the layer 15 is applied between the n-type semiconductor layer 15 and the platinum electrode (not shown). This is why the two parts of the layer 15, located beneath the electrodes 16S and 16D, are electrically isolated from each other.

An electric current can be supplied to the layer 15 in order to anodically oxidize said portion of the layer 15, through the metal film 16, the transparent conductive film 18 formed on the metal film 16 and the drain electrode 16D (i.e., a part of the metal film 16). Therefore, the n-type semiconductor layers 15 of all thin-film transistor elements which are arranged along the data line DL can be anodically oxidized uniformly.

[Step 7]

Figure 9D:
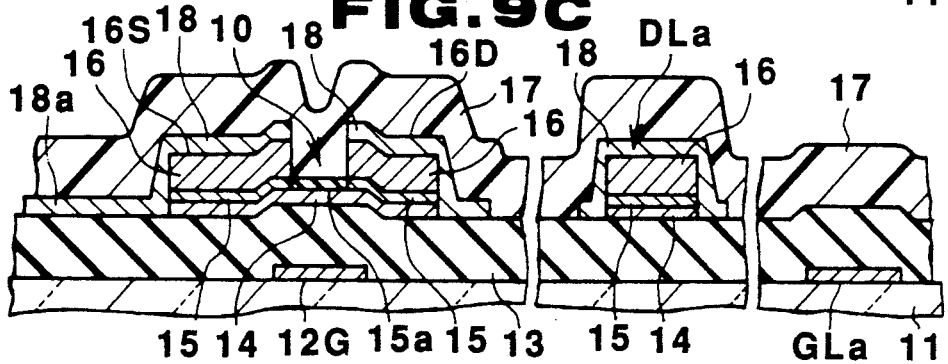

Next, the resist mask 23 is removed, and a protective insulation film 17 made of SiN or the like is formed on the substrate 11, thus covering all components formed on the substrate 11, as is shown in FIG. 9D.

[Step 8]

Figure 9E:
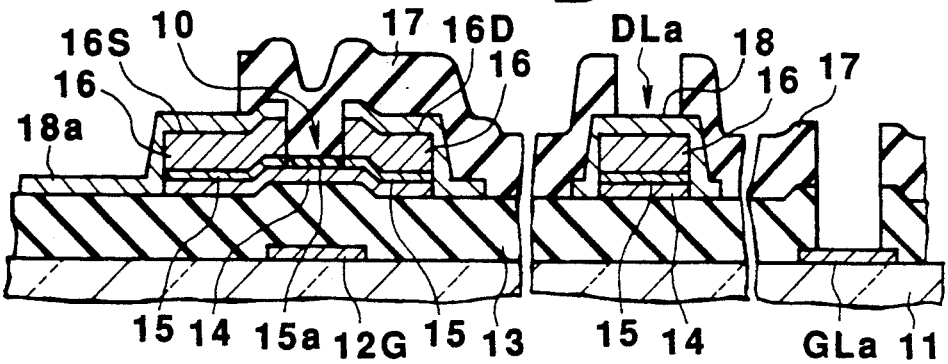

As is shown in FIG. 9E, the protective insulation film 17 is patterned by photolithography, such that its portion on the pixel electrode 18a, its portion on the terminal portion DLa of the drain line DL, and its portion on the terminal portion GLa of the gate line GL are removed. At the same time, that portion of the gate-insulating film 13 which is located on the terminal portion GLa of the gate line GL is removed by means of etching, thereby exposing the pixel electrode 18a, the terminal portion DLa of the drain line DL, and the terminal portion GLa of the gate line GL. Thus, a TFT panel is manufactured.

In the method of manufacturing the TFT panel, described above, that portion of the n-type semiconductor layer 15, which extends between the source electrode 16S and the drain electrode 16D, is oxidized anodically, becoming an insulative layer 15a and electrically dividing the layer 15 into two portions. In other words, no part of the n-type semiconductor layer 15 is not etched away to form two n-type semiconductor layers. Hence, no damage is done to the i-type semiconductor layer 14, without forming a blocking layer on the channel region of the i-type semiconductor layer 14. The method need not have a step of forming such a blocking layer.

In the method of manufacturing a TFT panel, described above, it suffices to form only four resist masks, whereas five resist masks must be formed in the conventional method. More specifically, the four resist masks are formed, respectively before:

(1) The gate metal film is patterned;

(2) The metal film 16, the n-type semiconductor layer 15, and the i-type semiconductor layer 14 are patterned into portions having the same shape as the drain line DL and into portions having the same shape as the transistor region;

(3) The transparent conductive film 18 is patterned, the metal film 16 is divided, and the n-type semiconductor layer 15 is partly oxidized anodically;

(4) The protective insulation film 17 is patterned.

Therefore, the TFT panel can be manufactured without damaging the i-type semiconductor layer 14 and requiring less resist masks, thus with high efficiency and at low cost.

Further, since no blocking layer needs to be formed on the channel region of the i-type semiconductor layer 14, it is possible with the method to manufacture TFT panels at a higher yield than is possible with the conventional method.

In the conventional method, the etching solution applied for patterning, by photolithography, the blocking layer formed on the i-type semiconductor layer etching the blocking layer leaks to the gate-insulating film though pinholes, if any, made in the i-type semiconductor layer, inevitably forming pinholes in the gate-insulating film. These pinholes result in the short-circuiting in the thin-film transistor or at the intersections of lines (e.g., short-circuiting between the gate electrode and the source or drain electrode, and the short-circuiting between the gate line and the drain line). Consequently, the net yield of TFT panels is low.

By contrast, in the method according of this invention, no blocking layer is formed on the i-type semiconductor layer, and no step is performed to pattern such a blocking layer. It follows that the gate-insulating film need not be etched at all, for patterning such a blocking layer. Hence, no inter-layer short-circuiting occurs, whereby TFT panels can be manufactured at a high yield.

In addition, the method of this invention is characterized in that the portion of the n-type semiconductor layer, which extends between the source and drain electrodes, is anodically oxidized, becoming an insulative layer electrically dividing the n-type layer into two conductive layers. Therefore, the i-type semiconductor layer is not damaged during the manufacture of the TFT panel, and a step of forming a blocking layer is unnecessary.

Since only four resist masks need to be formed in the method of the present invention, the TFT panel can manufactured with higher efficiency and, hence, at lower cost, than in the conventional method in which four resist masks must be formed to manufacture a TFT panel of the same type.

A method of manufacturing a TFT panel, which is a fourth embodiment of the invention, will now be described with reference to FIGS. 11A to 11F and FIG. 12. FIGS. 11A to 11F are cross-sectional views explaining this method, and FIG. 12 is a plan view of the thin-film transistor panel made by this method.

[Step 1]

Figure 11A:
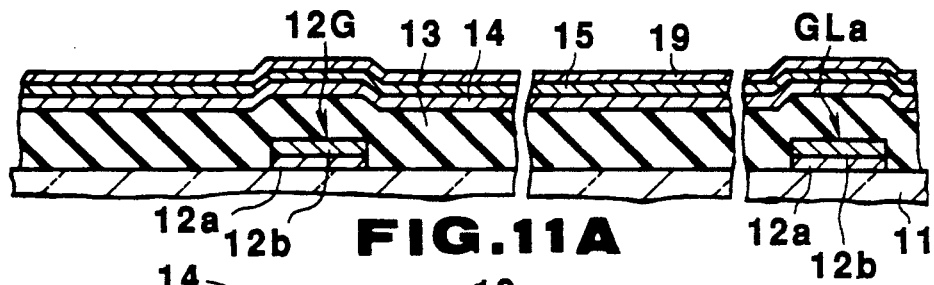
FIGS. 11A to 11F are cross-sectional views explaining a method of a thin-film transistor panel which is a fourth embodiment of this invention.
Figure 12:
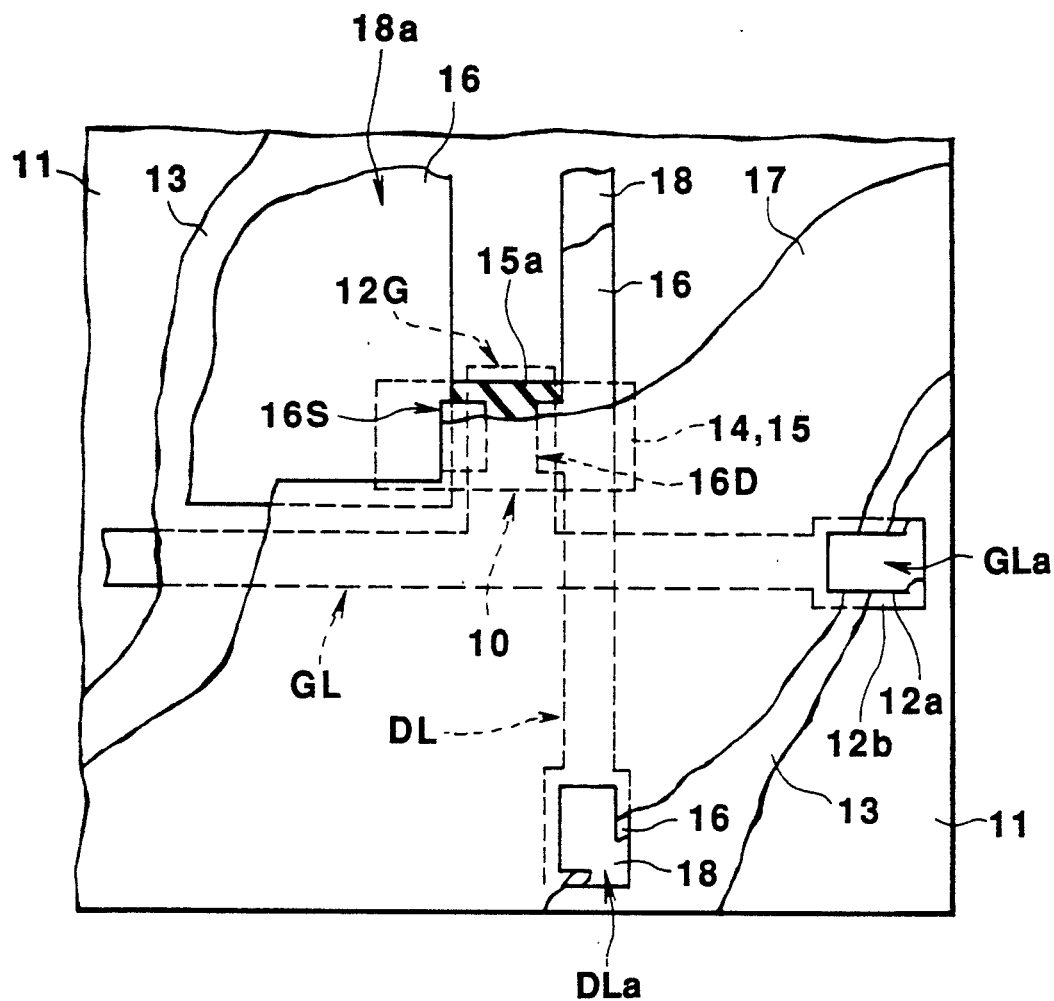
FIG. 12 is a plan view of the thin-film transistor panel according to the fourth embodiment of the present invention.

As is shown in FIG. 11A, a gate line GL (FIG. 12) and a gate electrode 12G are formed on a transparent substrate 11 made of glass or the like. The gate line GL consists of a lower film 12a and an upper film 12b, and the gate electrode 12G also consists of a lower film 12a and an upper film 12b. Each lower film 12a is formed on the substrate 11 and made of ITO or the like, and each upper film 12b formed on the lower film 12a and made of Al or an Al alloy. The gate line GL and the gate electrode 12G have been made by forming a lower film on the substrate 11 and an upper film on the lower film and then by patterning both films by means of photolithography.

[Step 2]

Next, as is seen in FIG. 11A, too, a gate-insulating film 13 made of SiN or the like is formed on the substrate 11, covering the gate line GL and the gate electrode 12G. An i-type semiconductor layer 14 made of a-Si is formed on the gate-insulating film 13. An n-type semiconductor layer 15 made of a-Si doped with an n-type impurity is formed on the i-type semiconductor layer 14. Further, a contact layer 19 made of Cr or the like and provided for a source and a drain is formed on the n-type semiconductor layer 15.

[Step 3]

Figure 11B:
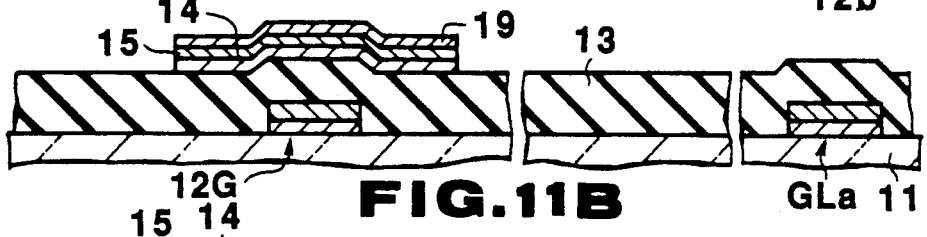

As is shown in FIG. 11B, the contact layer 19, the n-type semiconductor layer 15, and the i-type semiconductor layer 14 are patterned by photolithography, thereby forming a transistor region.

[Step 4]

Figure 11C:
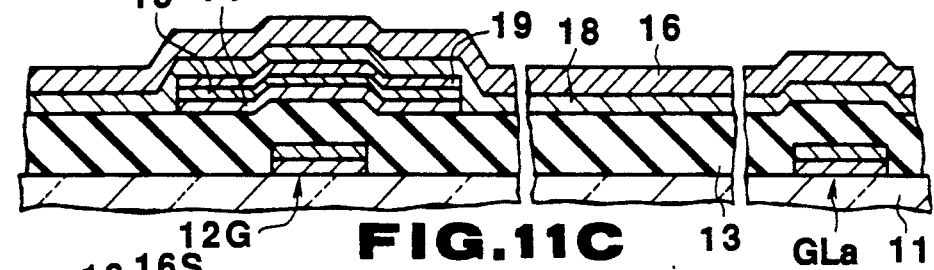

Then, as is shown in FIG. 11C, a transparent conductive film 18 made of ITO or the like is formed on the gate-insulating film 13, covering the patterned layers 16, 15 and 14. Further, a metal film 16 made of Al or an Al alloy is formed on the conductive film 18. The metal film 16 will be processed to form a source electrode and a drain electrode.

[Step 5]

Figure 11D:
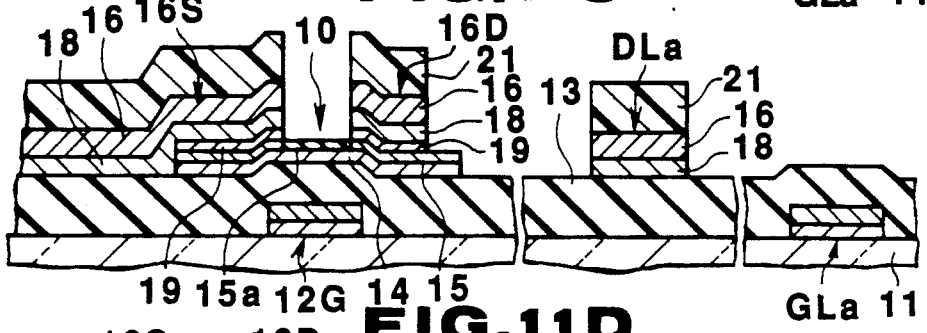

As can be understood from FIG. 11D, the metal film 16 and the transparent conductive film 18 are patterned by photolithography, forming a pixel electrode 18a, a source electrode 16S, a drain electrode 16D, and a drain line DL (see FIG. 12). Using the resist mask 21 used in patterning the films 16 and 18, the contact layer 19 is etched partly and divided into two portions, which are located below the source electrode 16S and the drain electrode 16D, respectively. In other words, that portion of the contact layer 19, which is not covered with the metal film 16 and the transparent conductive film 18, is removed by etching, thereby forming two portions which are substantially identical in size and shape to the electrodes 16S and 16D, respectively.

The source electrode 16S and the drain electrode 16D, which have been formed in Steps 3, 4, and 5, consist of three layers each, i.e., a part of the contact layer 19, a part of the conductive film 18, and a part of the metal film 16. The drain line DL consists of two layers, a part of the conductive film 18 and a part of the metal film 16.

[Step 5]

Next, as is shown in FIG. 11D, using the resist mask 21 used in patterning the metal film 16 and the conductive film 18, that portion of the n-type semiconductor layer 15 which extends between the electrodes 16S and 16D is oxidized anodically. This portion of the layer 15, which is now insulative, electrically isolates the resulting two portions of the layer 15. As a result, a thin-film transistor element 10 is formed.

The anodic oxidation of the n-type semiconductor layer 15 is achieved by immersing the substrate 11 in an electrolytic solution, opposing the layer 15, acting as anode, to a platinum electrode (not shown) also immersed in the electrolytic solution and functioning as cathode, and applying a voltage between the layer 15 and the platinum electrode. That portion of the layer 15, which is not covered with the resist mask 21 and which contacts the electrolytic solution, undergoes a chemical reaction and is oxidized anodically. This portion of the n-type semiconductor layer 15 is thereby changed to an insulation layer 15a.

The depth or thickness to which the n-type semiconductor layer 15 is oxidized depends, mainly on the voltage applied between the layer 15 and the platinum electrode. Hence, the selected portion of the layer 15 is anodically oxidized in its entirely, provided that a voltage proportional to the thickness of the layer 15 is applied between the n-type semiconductor layer 15 and the platinum electrode (not shown). This is why the two parts of the layer 15, located beneath the electrodes 16S and 16D, are electrically isolated from each other.

An electric current can be supplied to the layer 15 in order to anodically oxidize said portion of the layer 15, through the transparent conductive film 18, the drain line DL (i.e., a part of the metal film 16) formed on the film 18, and the contact layer 19 for the drain electrode 16D. Therefore, not only the n-type semiconductor layer 15 of the thin-film transistor 10, but also the n-type semiconductor layers of other thin-film transistors (not shown), which are arranged along the data line DL, can be anodically oxidized uniformly.

[Step 7]

Figure 11E:
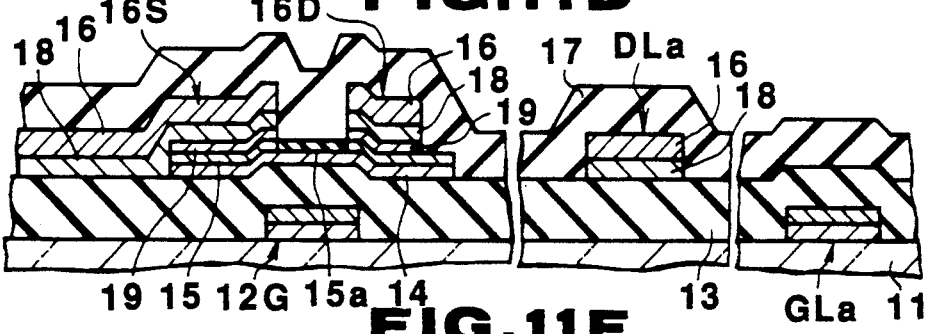
Figure 11F:
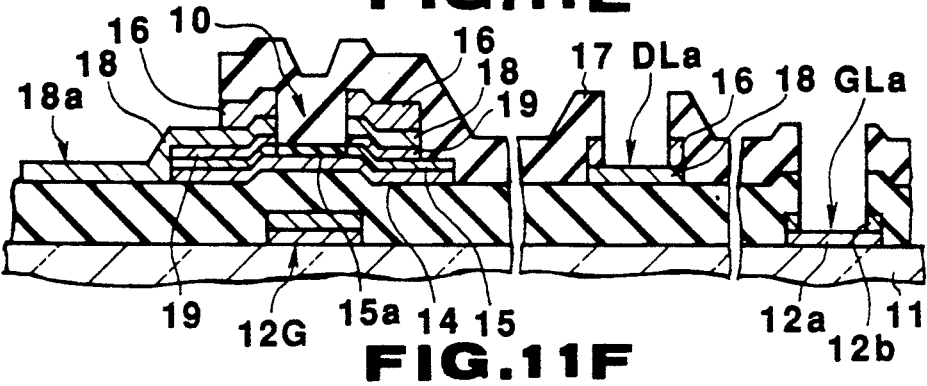

Next, the resist mask 21 is removed, and a protective insulation film 17 made of SiN or the like is formed on the substrate 11, thus covering all components formed on the substrate 11, as is shown in FIG. 11E.

[Step 8]

As is shown in FIG. 11E, too, the protective insulation film 17 is patterned by photolithography, such that its portion on the pixel electrode 18a, its portion on the terminal portion DLa of the drain line DL, and its portion on the terminal portion GLa of the gate line GL were removed. At the same time, that portion of the gate-insulating film 13 which is located on the terminal portion GLa of the gate line GL is removed by means of etching, thereby exposing the pixel electrode 18a, the terminal portion DLa of the drain line DL, and the terminal portion GLa of the gate line GL.

[Step 9]

Then, as can be understood from FIG. 10F, using the resist mask (not shown) once used in patterning the insulation films 17 and 13, that portion of the metal film 16 which is located on the pixel electrode 18a is removed by etching. Thereafter, the resist mask is removed, whereby a TFT panel is manufactured.

In the method according to the aforementioned embodiment of the invention, the upper film (i.e., a part of the film 16) of the terminal portion DLa and the upper film 12b (made of Al or an Al alloy) of the terminal portion GLa, both already exposed by patterning the insulation films 17 and 13, are etched when that portion of the metal film 16 which is formed on the pixel electrode 18a is etched. Nonetheless, the lower film 18 of the terminal portion DLa and the lower film 12a of the terminal portion GLa, both made of ITO or the like, are hardly etched since they are much harder to etch than the upper films of the terminal portions DLa and GLa. The lower films 18 and 12a therefore remain intact, and function as the terminal portions DLa and GLa, respectively.

In the this embodiment, the portion of the n-type semiconductor layer 15, which extends between the source and drain electrodes 16S and 16D, is anodically oxidized, becoming an insulative layer. This insulative layer electrically divides the n-type layer 15 into two conductive layers. Since no part of the n-type semiconductor layer 15 is not removed by etching as in the prior-art method, the i-type semiconductor layer 14 is not damaged during the manufacture of the TFT panel even if a blocking layer is not formed on the channel region of the layer 14. Hence, a step of forming a blocking layer is not necessary in this method, either.

Further, only four resist films need to be formed in the method according to the fourth embodiment of the invention, whereas five resist masks must be formed in the conventional method. More specifically, the four resist masks are formed, respectively, before:

(1) The gate metal film 12 is patterned to form the upper and lower layers 12a and 12b;

(2) The contact layer 19, the n-type semiconductor layer 15, and the i-type semiconductor layer 14 are patterned to form the transistor region;

(3) The metal film 16 and the transparent conductive film 18 are patterned, the contact layer 19 is etched partly and divided into two portions, and the selected portion of the n-type semiconductor layer 15 is oxidized anodically;

(4) The protective insulation film 17 is patterned, that portion of the gate-insulating film 13 which is located on the terminal portion GLa of the gate line GL is removed, and that portion of the metal film 16 which is located on the pixel electrode 18a is removed.

Therefore, the TFT panel can be manufactured by this method with higher efficiency and, thus, at lower cost, than is possible with the conventional method. Further, since no blocking layer needs to be formed on the channel region of the i-type semiconductor layer 14, TFT panels can be manufactured by the method at a higher yield than is possible with the prior-art method.

As has been described, the gate line GL and the gate electrode 12G are of two-layered structure in this embodiment, each comprised of a lower film 12a made of ITO or the like and an upper film 12b made of Al or an Al alloy. Instead, the lower film 12a may be made of Al or an Al alloy, and the upper film 12b may be made of ITO or the like, so that the terminal portion GLa of the gate line GL can remain in the form of a two-layered film.

Moreover, the gate line GL and the gate electrode 12G can be formed of only one metal film each. In the case where the line GL and the electrode 12G consist of a single metal film each, the terminal portion GLa of the gate line GL will not be etched away when the metal film 16 is partly removed to form the electrodes 16S and 16D, provided that said metal film is harder to etch than the metal film 16 or is anodically all over its surface.

A method of manufacturing a TFT panel, which is a fifth embodiment of the invention, will now be described with reference to FIGS. 13 to 16 and FIGS. 17A to 17H.

Figure 13:
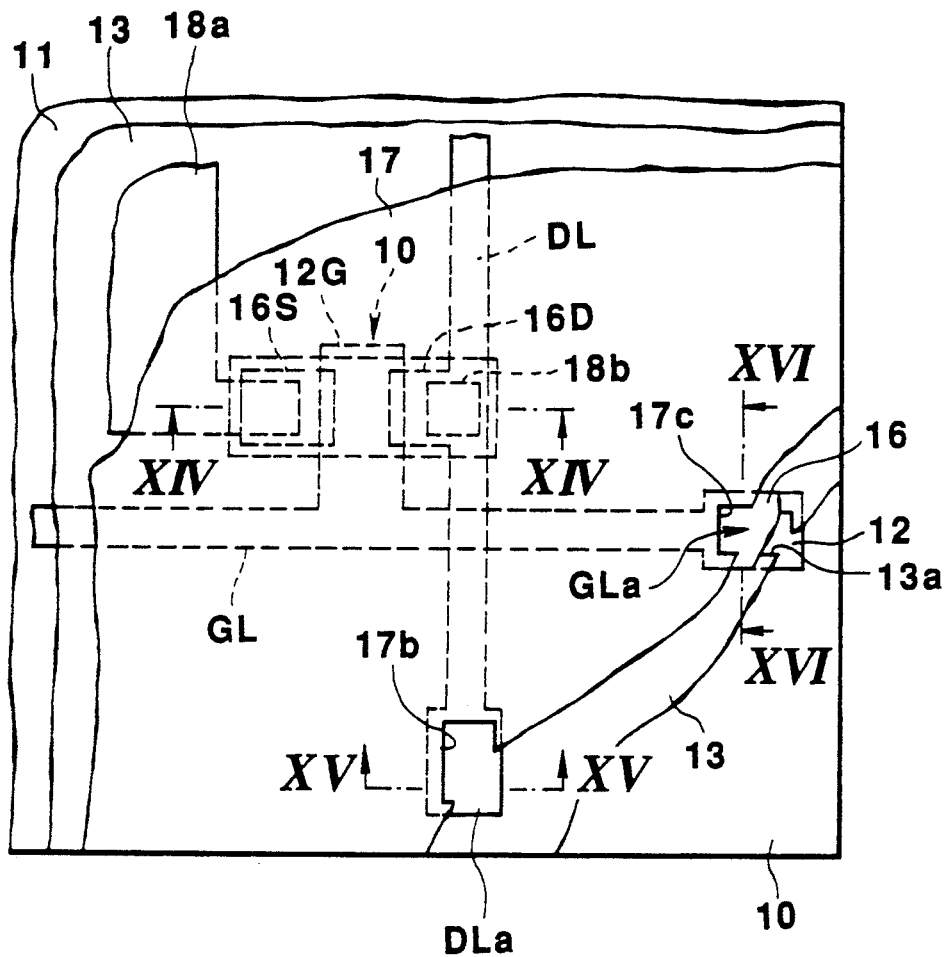
FIG. 13 is a plan view of a thin-film transistor panel according to the fifth embodiment of the present invention.
Figure 15:
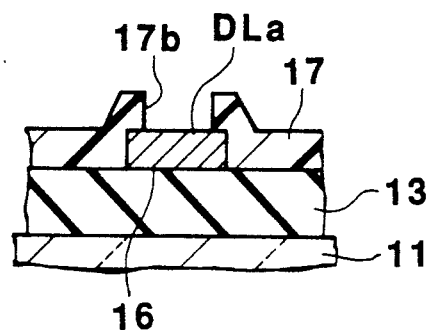
Figure 16:
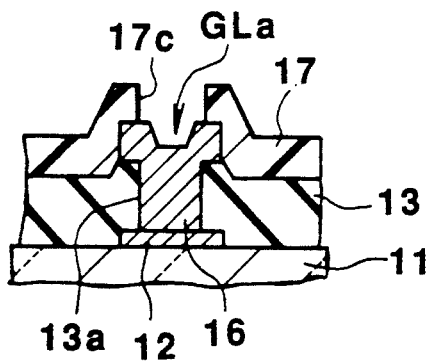

The TFT panel manufactured by this method will be described first, with reference to FIGS. 13 to 16. FIG. 13 is a plan view of the panel, and FIGS. 14 to 16 are enlarged, cross-sectional views of the panel, taken along line XIV–XIV, line XV–XV and line XVI–XVI in FIG. 13, respectively.

This TFT panel comprises a transparent substrate 11 made of glass or the like, a pixel electrode 18a formed on the substrate 11, and a thin-film transistor (TFT) element 10 formed on the substrate 11 and functioning as an active element for the electrode 18a.

Figure 14:
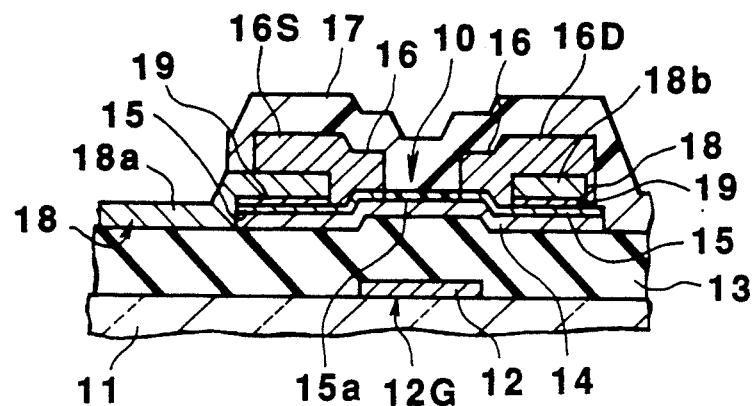
FIGS. 14 to 16 are cross-sectional views of the thin-film transistor panel shown in FIG. 13, taken along line XIV—XIV, line XV—XV and line XVI—XVI, respectively.

As is clearly seen from FIGS. 13 and 14, the thin-film transistor element 10 comprises a gate electrode 12G formed on the substrate 11, a gate-insulating film 13 covering the gate electrode 12G, an i-type semiconductor layer 14 formed on a portion of the gate-insulating film 13, an n-type semiconductor layer 15 formed on the i-type semiconductor layer 14, a contact layer 19 formed on the n-type semiconductor layer 15, a source electrode 16S formed on the contact layer 19, and a drain electrode 16D formed on the contact layer 19.

The i-type semiconductor layer 14 is made of a-Si, the n-type semiconductor layer 15 is made of a-Si doped with an n-type impurity, and the contact layer 19 is formed of metal such as Cr.

The gate electrode 12G is integral with a gate line GL formed on the substrate 11. The gate-insulating film 13 covers both the gate electrode 12G and the gate line GL, and is formed on almost the entire surface of the substrate 11. The film 13 is made of SiN or the like. Formed on the gate-insulating film 13 is a data line DL which is connected to the drain electrode 16D. The gate electrode 12G and the gate line GL are formed of a gate metal film 12 which is made of aluminum or an aluminum alloy. The source electrode 16S, the drain electrode 16D, and the data line DL are formed of a drain metal film 16 which is made of aluminum or an aluminum alloy.

The pixel electrode 18a is formed on the gate-insulating film (i.e., a transparent film) 13. The electrode 18a is formed of a transparent conductive film 18 made of ITO or the like. It has an end portion formed interposed between the source contact layer 19 and source electrode 16S of the thin-film transistor element 10 and, hence, connected to the the source electrode 16S. That end portion of the pixel electrode 18a has an area smaller than that of the source electrode 16S. The source electrode 16S has a portion which does not contact the end portion of the pixel electrode 18a and which directly contacts the n-type semiconductor layer 15.

A conductive layer 18b made of the same transparent material (i.e., ITO or the like) as the pixel electrode 18a is interposed between the drain electrode 16D of the thin-film transistor element 10 and the contact layer 19 located below the drain electrode 16D. Those portions of the contact layer 19, which are located below the source and drain electrodes 16S and 16D of the transistor element 10, respectively, are identical in shape to the terminal portion of the electrode 18a and the conductive layer 18b, respectively. The conductive layer 18b and that portion of the contact layer 19, located below the drain electrode 16D, have an area each, which is smaller than that of the drain electrode 16D, and is covered with the drain electrode 16D. That portion of the drain electrode 16D, which does not cover the conductive layer 18b, contacts the n-type semiconductor layer 15 directly.

The n-type semiconductor layer 15 of the thin-film transistor element 10 is formed on the entire surface of the i-type semiconductor layer 14. That portion of the layer 15, which extends between the source electrode 16S and the drain electrode 16D, has been anodically oxidized in its entirety and, hence, is an insulative layer 15a.

The TFT panel of this embodiment has a protective insulation film 17 which is a top layer, is transparent and made of SiN or the like. As is shown in FIGS. 13 and 15, the film 17 has an opening 17b. Though this opening 17b, the terminal portion DLa of the data line DL is exposed.

As is shown in FIGS. 13 and 16, the terminal portion GLa of the gate line GL consists of two layers. The lower layer is a part of the gate metal film 12, and the upper film is a part of the metal film 16. The metal film 16 is laid on the lower film (i.e., a part of the gate metal film 12), filling up the opening 13a made in the gate-insulating film 13. The terminal portion GLa is exposed through the opening 17b made in the protective insulation film 17.

The TFT panel, which is the fifth embodiment of the invention, is characterized in that the portion of the n-type semiconductor layer 15, which extends between the source electrode 16S and the drain electrode 16D, is anodically oxidized, forming the insulative layer 15a which divides the layer 15 into two parts electrically isolated from each other and provided for the source and drain of the thin-film transistor 10, respectively. Therefore, this TFT panel have the same advantages as the TFT panels according to the first to fourth embodiments.

As has been indicated above, the pixel electrode 18a is interposed between the source electrode 16S and that portion of the contact layer 19 located below the source electrode 16S, and the conductive layer 18b is interposed between the drain electrode 16D of the thin-film transistor 10 and the contact layer 19 located below the drain electrode 16D. Both the electrode 18a and the conductive layer 18b are made of the same transparent material. Further, those portions of the contact layer 19, which are located below the source and drain electrodes 16S and 16D of the transistor 10, respectively, are identical in shape to the terminal portion of the electrode 18a and the conductive layer 18b, respectively. Therefore, the pixel electrode 18a and the contact layer 19 can be patterned in one and the same step.

It will now be explained how the TFT panel according to the fifth embodiment of the invention is manufactured, with reference to FIGS. 17A to 17H which are cross-sectional views of the TFT panel.

[Step 1]

Figure 17A:
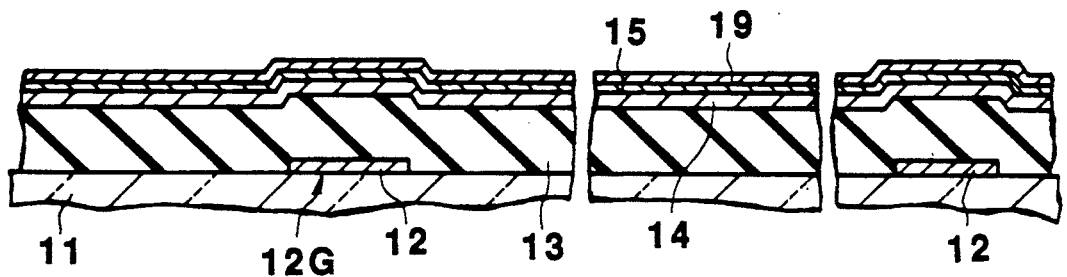
FIGS. 17A to 17H are cross-sectional views explaining a method of manufacturing a thin-film transistor panel which is a fifth embodiment of the present invention.

First, as is shown in FIG. 17A, the gate electrode 12G and the gate line GL (see FIG. 13) are formed on the substrate 11 made of glass or the like. The electrode 12G and the gate line GL are formed by depositing the gate metal film 12 on the substrate 11 and patterning the film 12 by means of photolithography. The metal film 12 shown at the upper-right corner of FIG. 17A is a part of the metal film 12 which is the lower film of the terminal portion GLa of the gate line GL.

[Step 2]

As is shown in FIG. 17A, too, the gate-insulating film 13 is formed on the substrate 11, covering the gate electrode 12G and the gate line GL. The i-type semiconductor layer 14 is formed on the gate insulating film 13. The n-type semiconductor layer 15 is formed on the i-type semiconductor layer 14. The contact layer 19 is formed on the n-type semiconductor layer.

[Step 3]

Figure 17B:
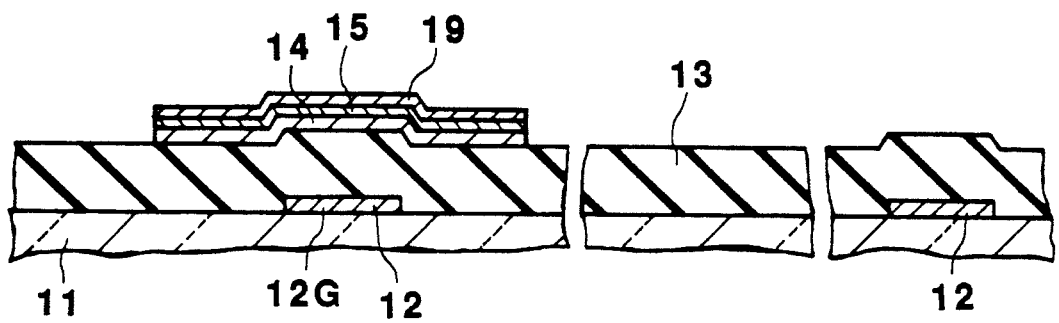

Next, as is shown in FIG. 17B, the contact layer 19, the n-type semiconductor layer 15, and the i-type semiconductor layer 14 are patterned by photolithography, whereby these layers 19, 15, and 14 come to have shape and size identical to a transistor region to be formed.

[Step 4]

Figure 17C:
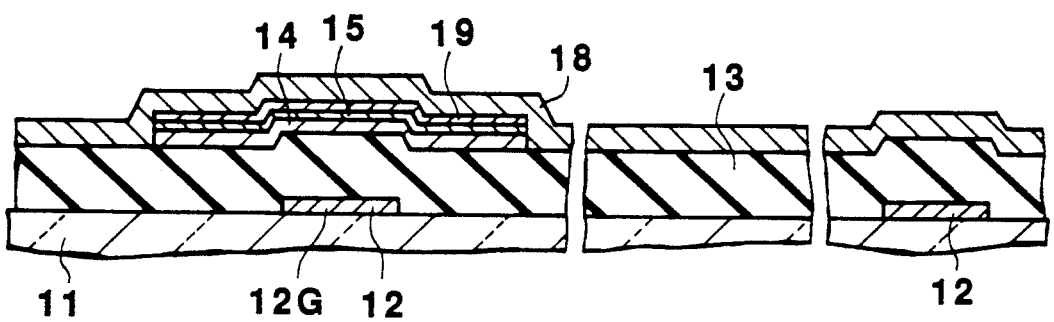

As is shown in FIG. 17C, the transparent conductive film 18 made of ITO or the like is formed on the substrate 11 an the gate-insulating film 13, covering the layers 14, 15, and 19 which have been patterned.

[Step 5]

Figure 17D:
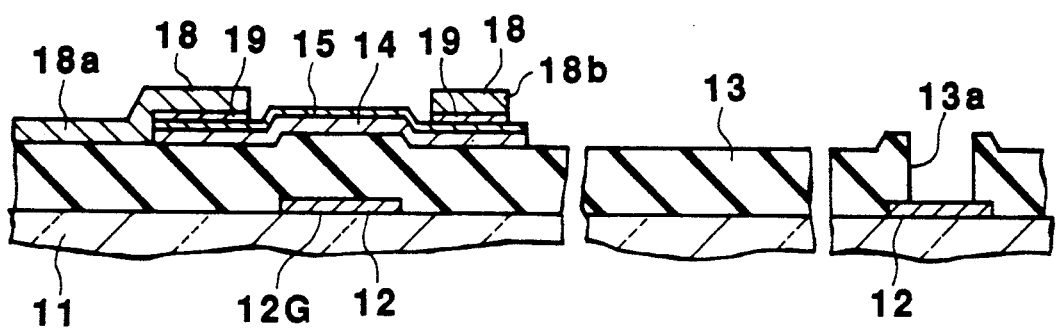

As is shown in FIG. 17D, the transparent conductive film 18 is patterned by photolithography, thereby forming the pixel electrode 18a having a terminal portion located at the position where the source electrode 16S will be formed, and also forming the conductive layer 18b located at the position where the drain electrode 16D will be formed. Further, the contact layer 19 is patterned, into two contact layers which have the same shape and size as the pixel electrode 18a and the conductive layer 18b, respectively. The terminal portion of the pixel electrode 18a and the contact layer located in the source region have an area smaller than the source-electrode region. The conductive layer 18b and the contact layer located in the drain region are located fully within the drain-electrode region and have an area smaller than the drain-electrode region.

[Step 6]

As can be seen from FIG. 17D, too, an opening 13a is made in the gate-insulating film 13 by means of photolithography, thereby exposing the terminal portion GLa of the gate line GL (i.e., a part of the gate metal film 12).

[Step 7]

Figure 17E:
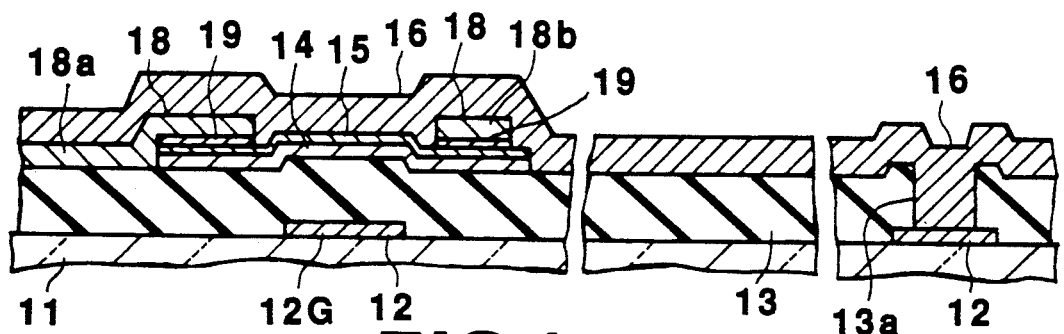

Next, as is shown in FIG. 17E, the metal film 16, which will be patterned to form the source electrode 16S and the drain electrode 16D, is formed on the gate-insulating film 13, covering the patterned transparent conductive film 18 and the like, and also filling the opening 13a made in the gate-insulating film 13.

[Step 8]

Figure 17F:
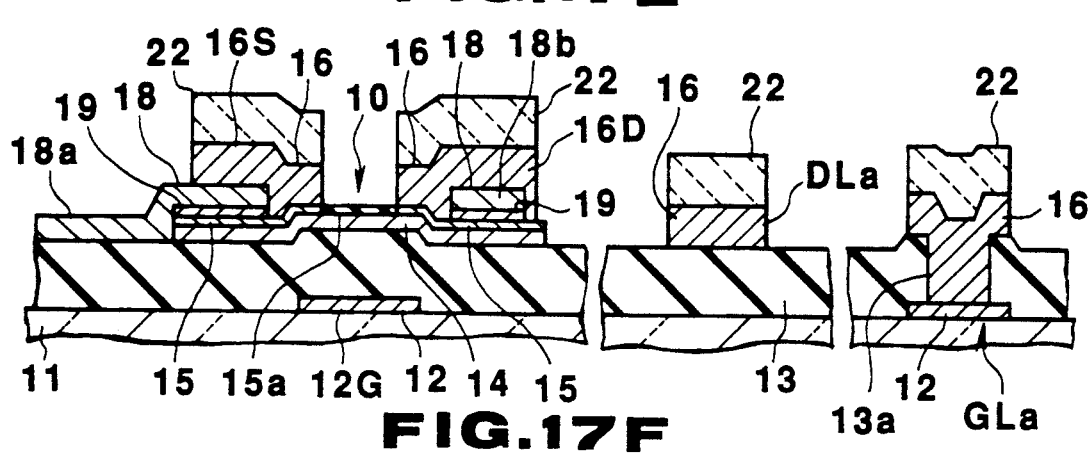

As is shown in FIG. 17F, the metal film 16 is patterned by photolithography, forming the source electrode 16S, the drain electrode 16D, the data line DL (see FIG. 15), and the upper film of the terminal portion GLa of the gate line GL. Both the source electrode 16S and the drain electrode 16D are large enough to cover the terminal portion of the pixel electrode 18a and the conductive layer 18b, respectively. In FIG. 17F, the terminal portion DLa of the data line DL is formed of the metal film 16 only.

[Step 9]

Then, as is shown in FIG. 17F, using the resist mask 23 which has been used in patterning the metal film 16, that portion of the n-type semiconductor layer 15, which extends between the source electrode 16S and the drain electrode 16S, is anodically oxidized in its entirety, forming the insulative layer 15a. This layer 15a divides the layer 15 into two parts electrically isolated from each other, whereby the thin-film transistor element 10 is made. The anodic oxidation of said portion of the layer 15 is performed in the same way as in any embodiments described above.

An electric current can be supplied to the layer 15 in order to achieve the anodic oxidation, through the data line DL and the drain electrode 16D. Therefore, the n-type semiconductor layers of all thin-film transistors (not shown) that are arranged along the data line DL, can be anodically oxidized uniformly. Since a resist mask 22 does not cover neither the sides of the drain electrode 16D nor the sides of the data line DL, the sides of both the electrode 16D and those of the data line DL are oxidized anodically. (The resultant oxide layers are not shown.) Nonetheless, the center portion of the electrode 16D or the center portion of the data line DL is not oxidized at all.

If the conductive layer 18b located beneath the drain electrode 16D extends outwards from the drain electrode 16D and, thus, had an exposed portion, an electric current would flow between this exposed portion of the layer 18b and the platinum electrode during the anodic oxidation. (The current would continuously flow between the exposed portion of the layer 18b and the platinum electrode since the layer 18b is made of an oxide, i.e., ITO or the like.) Consequently, virtually no current would flow to the n-type semiconductor layer 15 and could not be anodically oxidized. In this embodiment, since the drain electrode 16D is large, covering up the conductive layer 18b, an electric current flows between the n-type semiconductor layer 15 and the platinum electrode, whereby that portion of the layer 15 which extends between the electrodes 16S and 16D is oxidized anodically.

[Step 10]

Figure 17G:
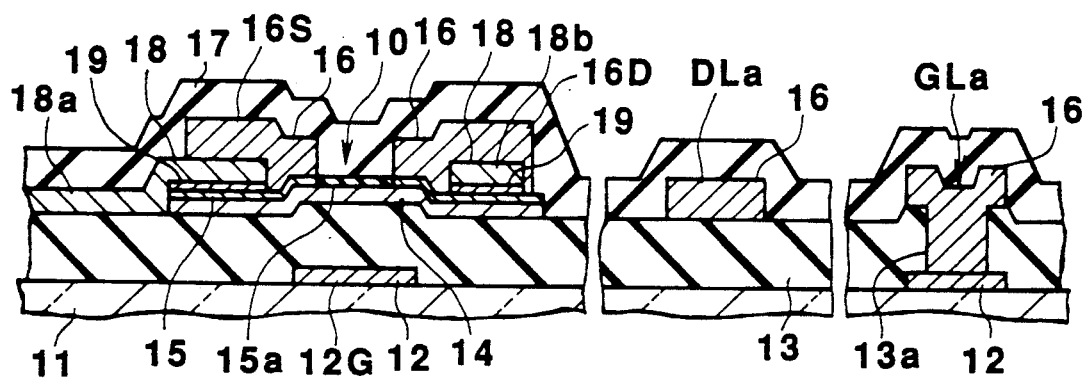

Then, the resist mask 22 is removed, and the protective insulation film 17 is formed as is shown in FIG. 17G.

[Step 11]

Figure 17H:
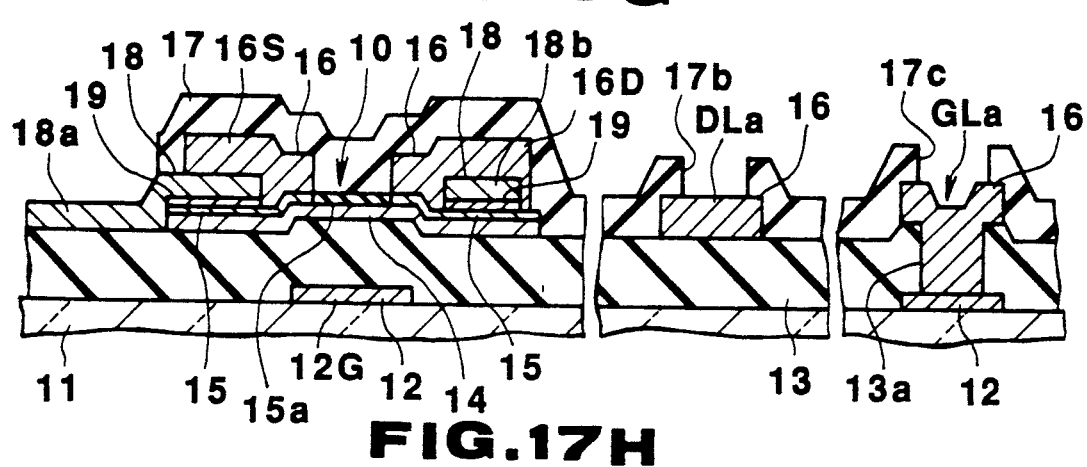
Figure 18A:
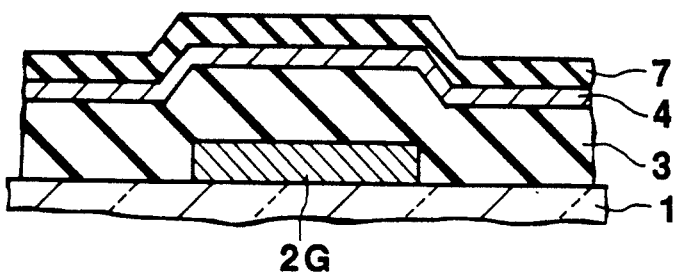
FIGS. 18A to 18E are cross-sectional view explaining a method of manufacturing a conventional thin-film transistor.
Figure 18B:
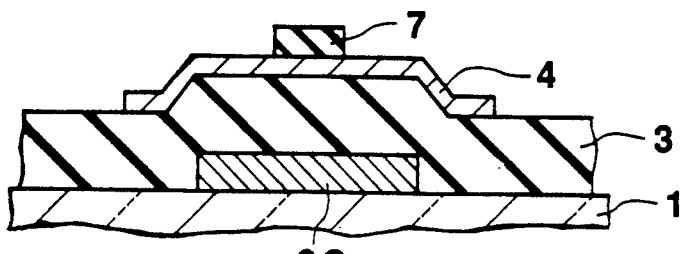
Figure 18C:
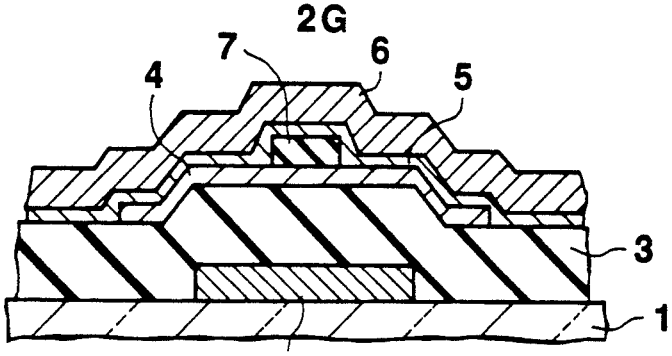
Figure 18D:
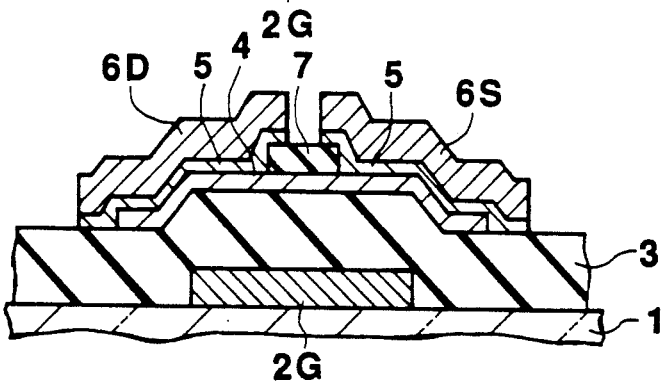
Figure 18E:
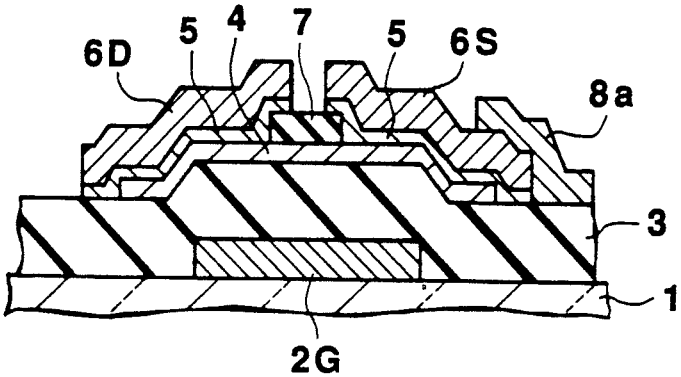

As is shown in FIG. 17H, the protective film 17 is patterned by photolithography, forming openings 17b and 17c in the film 17, thereby exposing the terminal portion DLa of the data line DL and an the terminal portion GLa of the gate line GL, respectively. The TFT panel is thereby manufactured.

In the method according to the fifth embodiment of the invention, the contact layer 19 is patterned into two parts identical in shape and size to the terminal portion of the pixel electrode 18a and the conductive layer 18b, respectively, in order to pattern the transparent conductive film 18 thereby to form the pixel electrode 18a and the conductive layer 18b on those portions of the metal film 16 which will be the source electrode 16S and the drain electrode 16D, respectively. Also, the n-type semiconductor layer 15 is anodically oxidized by the use of the resist mask 22 once used in patterning the metal film 16, whereby that portion of the layer 15 between the electrodes 16S and 16D becomes the insulation layer 15a. Hence, it suffices to form less resist masks than is required in the conventional method of manufacturing TFT panels of the same type. More specifically, six resist masks are formed, respectively before:

(1) The gate metal film 12 is patterned;

(2) The contact layer 19, the n-type semiconductor layer 15, and the i-type semiconductor layer 14 are patterned to form the transistor region;

(3) The transparent conductive film 18 and the contact layer 19 beneath the film 18 are patterned;

(4) The opening 13a is formed in the gate-insulating film 13;

(5) The metal film 16 is patterned, and the n-type semiconductor layer 15 is anodically oxidized partly;

(6) The openings 17b and 17c are formed in the protective insulation film 17.

Therefore, the TFT panel can be manufactured by this method with higher efficiency and, thus, at lower cost, than is possible with the conventional method.

As has been described, the terminal portion GLa of the gate line GL is of two-layered structure comprised of a lower film formed of a part of the gate metal film 12 and an upper film formed of a part of the metal film 16. Instead, the terminal portion GLa may be comprised of a part of the gate metal film 12 only. If the portion GLa is made so, the opening 13a can be formed at the same time the openings 17b and 17c are formed in the protective insulation film 17. In this case, Step 6 need not be carried out, whereby the number of resist masks required is reduced by one.

In the fifth embodiment of the invention, that portion of the n-type semiconductor layer 15, which extends between the source electrode 16S and the drain electrode 16D, is oxidized in an electrolytic solution bath. Instead, this portion of the layer 15 can be oxidized by plasma oxidation which is performed in a gas atmosphere.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A thin-film transistor comprising an insulative substrate and a thin-film transistor element arranged on the substrate, said thin-film transistor element comprising:
   a gate electrode;
   a gate-insulating film;
   an i-type semiconductor layer to face the gate electrode through the gate insulating film therebetween;
   an n-type semiconductor layer having an anodically oxidized region;
   source and drain electrodes electrically connected to portions of the i-type semiconductor layer through the n-type semiconductor layer and having anodically oxidized surface regions for protecting said source and drain electrodes and isolated from each other by the anodically oxidized region of said n-type semiconductor layer which is located between said source and drain electrodes; and
   a data line electrically connected to said drain electrode and having an anodically oxidized surface region for protecting said data line.

2. The thin-film transistor according to claim 1, further comprising a pixel electrode, a contact layer and a first transparent conductive film located between said source electrode and said n-type semiconductor layer, and a contact layer and a second transparent conductive film located between said drain electrode and said n-type semiconductor layer to provide ohmic contacts between said source electrode and said n-type semiconductor layer, and between said drain electrode and said n-type semiconductor layer, the first transparent conductive film located between said source electrode and said n-type semiconductor layer being integrally formed with the pixel electrode.

3. The thin-film transistor according to claim 2, wherein said drain electrode covers said second transparent conductive film.

4. The thin film transistor according to claim 2, wherein said first and second transparent conductive films are made of oxide.

5. The thin film transistor according to claim 2, wherein said first and second transparent conductive films are made of ITO.

6. The thin film transistor according to claim 1, wherein said source and drain electrodes, and said data line are made of aluminum or aluminum alloy.

7. The thin-film transistor according to claim 1, wherein said source and drain electrodes are made of metal and have a thickness of 200 to 500 nm, and said n-type semiconductor layer has a thickness of 25 to 100 nm.

8. The thin-film transistor according to claim 1, wherein a resistivity of said i-type semiconductor layer is 100 or more times greater than a resistivity of said n-type semiconductor layer.

9. A thin-film transistor panel comprising an insulative substrate and a plurality of thin-film transistor elements arranged at predetermined intervals on the substrate, and connecting means electrically connecting said thin-film transistor elements, each of said thin-film transistor elements comprising:
   a gate electrode;
   a gate-insulating film;
   an i-type semiconductor layer to face the gate electrode through the gate insulating film therebetween;
   an n-type semiconductor layer having an anodically oxidized region; and
   source and drain electrodes electrically connected to portions of the i-type semiconductor layer through the n-type semiconductor layer and having anodically oxidized surface regions for protecting said source and drain electrodes and isolated from each other by the anodically oxidized region of said n-type semiconductor layer which is located between said source and drain electrodes;
   said connecting means including data lines electrically connected to said drain electrodes of said thin-film transistor elements, and having an anodically oxidized surface region.

10. The thin-film transistor panel according to claim 9, wherein each of the thin-film transistor elements further comprises:
    a pixel electrode;
    a contact layer and a first transparent conductive film located between said source electrode and said n-type semiconductor layer, providing an ohmic contact between said source electrode and said n-type semiconductor layer; and
    wherein the first transparent conductive film located between said source electrode and said n-type semiconductor layer is integrally formed with the pixel electrode.

11. The thin-film transistor panel according to claim 10, wherein each of said drain electrodes covers a corresponding one of the second transparent conductive films.

12. The thin film transistor panel according to claim 11, wherein said first and second transparent conductive films are made of oxide.

13. The thin film transistor panel according to claim 11, wherein said first and second transparent conductive films are made of ITO.

14. The thin film transistor panel according to claim 9, wherein said source and drain electrodes, and said data line are made of aluminum or aluminum alloy.

15. The thin-film transistor panel according to claim 9, wherein said source and drain electrodes are made of metal and have a thickness of 200 to 500 nm, and said n-type semiconductor layers have a thickness of 25 to 100 nm.

16. The thin-film transistor panel according to claim 9, wherein a resistivity of said i-type semiconductor layers is 100 or more times greater than a resistivity of said n-type semiconductor layers.

17. A thin-film transistor panel comprising a plurality of thin-film transistor elements arranged in a matrix form, and data lines and gate lines connected to said thin-film transistor elements, each of said thin-film transistor elements comprising:
a gate electrode;
a gate-insulating film;
an i-type semiconductor layer to face the gate electrode through the gate insulating film therebetween;
an n-type semiconductor layer having an anodically oxidized region; and
source and drain electrodes electrically connected to the portions of the i-type semiconductor layer through the n-type semiconductor layer and isolated from each other by the anodically oxidized region of said n-type semiconductor layer which is located between said source and drain electrodes; and each of said data lines having an anodically oxidized surface region.

18. The thin film transistor panel according to claim 17, wherein said source and drain electrodes, and said data lines are made of aluminum or aluminum alloy.

19. A thin-film transistor panel comprising an insulative substrate, thin-film transistor elements arranged in a matrix form on the substrate, and pixel electrodes connected to the thin-film transistor elements, each of said thin-film transistor elements comprising:

a gate electrode;
a gate-insulating film;
an i-type semiconductor layer to face the gate electrode through the gate insulating film therebetween;
an n-type semiconductor layer;
source and drain electrodes;
a first contact layer and a first transparent conductive film located between said source electrode and said n-type semiconductor layer for providing an ohmic contact between said source electrode and said n-type semiconductor layer, and
a second contact layer and a second transparent conductive film located between said drain electrode and said n-type semiconductor layer for providing an ohmic contact between said drain electrode and said n-type semiconductor layer,
the first transparent conductive films located between said source electrodes and said n-type semiconductor layers are integrally formed with the pixel electrodes, and said drain electrodes cover respective ones of said second transparent conductive films.

20. The thin film transistor panel according to claim 19, wherein said first and second transparent conductive films are made of ITO.

* * * * *